(12) United States Patent
Egawa

(10) Patent No.: US 7,646,086 B2
(45) Date of Patent: Jan. 12, 2010

(54) SEMICONDUCTOR PACKAGE

(75) Inventor: Yoshimi Egawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 72 days.

(21) Appl. No.: 11/525,868

(22) Filed: Sep. 25, 2006

(65) Prior Publication Data

US 2007/0075413 A1    Apr. 5, 2007

(30) Foreign Application Priority Data

Sep. 30, 2005    (JP) .............................. 2005-287552

(51) Int. Cl.
   *H01L 23/02* (2006.01)
(52) U.S. Cl. ........................ 257/686; 257/621; 257/774; 257/E23.08; 257/E23.169
(58) Field of Classification Search ................ 257/621, 257/774, 686, E23.08, E23.169
   See application file for complete search history.

(56) References Cited

U.S. PATENT DOCUMENTS

2004/0051170 A1* 3/2004 Kawakami et al. .......... 257/686

2005/0014311 A1* 1/2005 Hayasaka et al. ........... 438/109
2005/0017338 A1* 1/2005 Fukazawa ................... 257/686
2005/0212114 A1* 9/2005 Kawano et al. ............. 257/690

FOREIGN PATENT DOCUMENTS

JP    2004-111656    4/2004

* cited by examiner

*Primary Examiner*—Eugene Lee
*Assistant Examiner*—Peniel M Gumedzoe
(74) *Attorney, Agent, or Firm*—Rabin & Berdo, PC

(57) ABSTRACT

A semiconductor package according to the present invention includes a substrate; first and second semiconductor chips mounted on a first surface of the substrate; and a heat-radiation sheet. The heat-radiation sheet includes a heat-transferable conductive layer and first and second insulating layers formed on top and bottom surfaces of the heat-transferable conductive layer, respectively. The heat-radiation sheet includes a first portion arranged between the first semiconductor chip and the second semiconductor chip; and a second portion extending at least a side of the first portion. The second portion is connected to the substrate. The second insulating layer of the second portion is formed to expose a part of the heat-transferable conductive layer.

5 Claims, 15 Drawing Sheets

(a)

(b)

(c)

(a)

(b)

(c)

(d)

(e)

(a)

(b)

(c)

(a)

(b)

(c)

(a)

(b)

(c)

SEMICONDUCTOR PACKAGE

CROSS REFERENCE TO RELATED APPLICATION

This application claims the priority of Application No. 2005-287552, filed on Sep. 30, 2005 in Japan, the subject matter of which is incorporated herein by reference.

TECHNICAL FIELD OF THE INVENTION

The present invention relates to, a semiconductor package and a method for fabricating the same. Particularly, the present invention relates to a three-dimensional package for semiconductor devices and a method for fabricating the same.

BACKGROUND OF THE INVENTION

Conventionally, for minimizing a semiconductor package, a multi-chip package structure has been used, in which a plurality of semiconductor chips is mounted in a single package to improve the packaging density. One type of such a multi-chip package structure is a three-dimensional package, in which a plurality of semiconductor chips is layered in a vertical direction.

However, according to such a three-dimensional package structure, in which a plurality of semiconductor chips is layered in a vertical direction, it might become difficult to radiate heat generated in the package if the number of semiconductor chips in the package is increased.

In that situation, for example, as shown in Patent Related Publication 1, a semiconductor package includes a heat transferable conductive sheet, provided between semiconductor chips, in order to radiate heat generated at the semiconductor chips. In the fourth embodiment of the patent related publication 1, it is described a heat transferable conductive sheet 38, which includes an approximately rectangle shield portion 38*m*, lead portions 38*n*, 38*n* . . . , extending from the four corners of the shield portion 38*m* to be connected to a substrate 35. Heat generated at a lower layer semiconductor chip 36 and an upper layer semiconductor chip 37 are transferred via connecting portions to the heat transferable conductive sheet 38, and radiated through the shield portion 38*m*, lead portions 38*n*, 38*n*, . . . and a ground wire 35*b*.

[Patent Related Publication 1] 2004-111656A

However, according to the conventional technology shown in the above described publication, an sufficient extent of heat may not be radiated when the number of layers in a semiconductor package is increased.

Objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor package includes:

a substrate, which comprises a first surface having a first region and a second region surrounding the first region, a second surface opposing to the first surface, and a first through electrode extending between the first surface and the second surface;

a first semiconductor chip, which comprises a third surface, a fourth surface opposing to the third surface and a second through electrode, extending between the third surface and the fourth surface to be electrically connected to the first through electrode of the substrate, wherein the first semiconductor chip is mounted on the first region of the substrate so that the first surface of the substrate and the third surface are faced with each other;

a heat-radiation sheet, which comprises a heat-transferable conductive layer, first and second insulating layers formed on fifth surface and sixth surfaces of the heat-transferable conductive layer, a first portion having a third through electrode extending between the fifth and sixth surfaces to be electrically connected to the second through electrode of the first semiconductor chip, and a second portion extending from at least a side of the first portion to be connected to the second region of the substrate, wherein the heat-radiation sheet is mounted on the first semiconductor chip so that the fourth surface and the fifth surface are faced with each other; and a second semiconductor chip, which comprises a seventh surface, an eighth surface opposing to the seventh surface and a fourth through electrode, extending between the seventh surface and the eighth surface to be electrically connected to the third through electrode of the heat-radiation sheet, wherein the second semiconductor chip is mounted on the first portion of the heat-radiation sheet so that the sixth surface and the seventh surface are faced with each other;

wherein the second insulating layer on the second portion of the heat-radiation sheet is formed to expose a part of the heat-transferable conductive layer.

According to a second aspect of the present invention, a semiconductor package includes:

a substrate, which comprises a first surface having a first region and a second region surrounding the first region, a second surface opposing to the first surface, and a first through electrode extending between the first surface and the second surface;

a first semiconductor chip, which comprises a third surface, a fourth surface opposing to the third surface and a second through electrode, extending between the third surface and the fourth surface to be electrically connected to the first through electrode of the substrate, wherein the first semiconductor chip is mounted on the first region of the substrate so that the first surface of the substrate and the third surface are faced with each other;

a heat-radiation sheet, which comprises a heat-transferable conductive layer, first and second insulating layers formed on fifth surface and sixth surfaces of the heat-transferable conductive layer, a first portion having a third through electrode extending between the fifth and sixth surfaces to be electrically connected to the second through electrode of the first semiconductor chip, and a second portion extending from at least a side of the first portion to be connected to the second region of the substrate, wherein the heat-radiation sheet is mounted on the first semiconductor chip so that the fourth surface and the fifth surface are faced with each other; and a second semiconductor chip, which comprises a seventh surface, an eighth surface opposing to the seventh surface and a fourth through electrode, extending between the seventh surface and the eighth surface to be electrically connected to the third through electrode of the heat-radiation sheet, wherein the second semiconductor chip is mounted on the first portion of the heat-radiation sheet so that the sixth surface and the seventh surface are faced with each other;

wherein a projected member is formed on the sixth surface of the second portion of the heat-radiation sheet.

According to a third aspect of the present invention, a semiconductor package includes:

a substrate, which comprises a first surface having a first region and a second region surrounding the first region, a second surface opposing to the first surface, and a first through electrode extending between the first surface and the second surface;

a first semiconductor chip, which comprises a third surface, a fourth surface opposing to the third surface and a second through electrode, extending between the third surface and the fourth surface to be electrically connected to the first through electrode of the substrate, wherein the first semiconductor chip is mounted on the first region of the substrate so that the first surface of the substrate and the third surface are faced with each other;

a heat-radiation sheet, which comprises a heat-transferable conductive layer, first and second insulating layers formed on fifth surface and sixth surfaces of the heat-transferable conductive layer, a first portion having a third through electrode extending between the fifth and sixth surfaces to be electrically connected to the second through electrode of the first semiconductor chip, and a second portion extending from at least a side of the first portion to be connected to the second region of the substrate, wherein the heat-radiation sheet is mounted on the first semiconductor chip so that the fourth surface and the fifth surface are faced with each other;

a second semiconductor chip, which comprises a seventh surface, an eighth surface opposing to the seventh surface and a fourth through electrode, extending between the seventh surface and the eighth surface to be electrically connected to the third through electrode of the heat-radiation sheet, wherein the second semiconductor chip is mounted on the first portion of the heat-radiation sheet so that the sixth surface and the seventh surface are faced with each other; and a sealing member which covers the first surface of the substrate, the first semiconductor chip, the heat-radiation sheet and the second semiconductor chip, wherein a first through hole is formed in the second portion of the heat-radiation sheet to extend between the fifth and sixth surfaces.

According to another aspect of the present invention, a method for fabricating a semiconductor package, comprising:

preparing a wafer having a plurality of chip regions arranged in matrix, each of which comprises a first surface having a first region and a second region surrounding the first region, a second surface opposing to the first surface, and a first through electrode extending between the first surface and the second surface;

mounting a first semiconductor chip, comprising a third surface, a fourth surface opposing to the third surface and a second through electrode, extending between the third surface and the fourth surface, on the first region of each of the chip regions so that the first through electrode is electrically connected to the second through electrode and the first surface of the chip region and the third surface are faced with each other;

preparing a heat-radiation sheet, which comprises a heat-transferable conductive layer, first and second insulating layers formed on fifth surface and sixth surfaces of the heat-transferable conductive layer, a first portion having a third through electrode extending between the fifth and sixth surfaces to be electrically connected to the second through electrode of the first semiconductor chip, and a second portion extending from at least a side of the first portion, wherein the second insulating layer of the second portion is formed to expose the heat-transferable conductive layer;

mounting the heat-radiation sheet on the first semiconductor chip so that the fourth surface and the fifth surface are faced with each other;

mounting a second semiconductor chip, which comprises a seventh surface, an eighth surface opposing to the seventh surface and a fourth through electrode, extending between the seventh surface and the eighth surface to be electrically connected to the third through electrode of the heat-radiation sheet, on the first portion of the heat-radiation sheet so that the sixth surface and the seventh surface are faced with each other;

connecting the second portion of the heat-radiation sheet to the second region of each of the chip regions; and dicing the wafer to form individual semiconductor packages after the first semiconductor chip, the heat-radiation sheet and the second semiconductor chip are mounted.

Preferably, the step for preparing the heat-radiation sheet comprises:

preparing the first insulating layer, having a third portion corresponding to the first portion of the heat-radiation sheet and a fourth portion corresponding to the second portion of the heat-radiation sheet;

forming the heat-transferable conductive layer on the first insulating layer;

forming a second through hole passing through the third portion and the heat-transferable conductive layer;

forming a second insulating layer, which covers an inner side surface of the second through hole and the heat-transferable conductive layer;

etching the second insulating layer so as to expose a part of the heat-transferable conductive layer;

forming a first conductive layer extending between the first insulating layer and the second insulating layer via the second through hole after forming the second insulating layer, so that the third through electrode having the second through hole and the first conductive layer is formed.

According to another aspect of the present invention, a method for fabricating a semiconductor package, comprising:

preparing a wafer having a plurality of chip regions arranged in matrix, each of which comprises a first surface having a first region and a second region surrounding the first region, a second surface opposing to the first surface, and a first through electrode extending between the first surface and the second surface;

mounting a first semiconductor chip, comprising a third surface, a fourth surface opposing to the third surface and a second through electrode, extending between the third surface and the fourth surface, on the first region of each of the chip regions so that the first through electrode is electrically connected to the second through electrode and the first surface of the chip region and the third surface are faced with each other;

preparing a heat-radiation sheet, which comprises a heat-transferable conductive layer, first and second insulating layers formed on fifth surface and sixth surfaces of the heat-transferable conductive layer, a first portion having a third through electrode extending between the fifth and sixth surfaces to be electrically connected to the second through electrode of the first semiconductor chip, and a second portion extending from at least a side of the first portion, wherein a projected member is formed on the sixth surface of the second portion;

mounting the heat-radiation sheet on the first semiconductor chip so that the fourth surface and the fifth surface are faced with each other;

mounting a second semiconductor chip, which comprises a seventh surface, an eighth surface opposing to the seventh surface and a fourth through electrode, extending between the seventh surface and the eighth surface to be electrically connected to the third through electrode of the heat-radiation sheet, on the first portion of the heat-radiation sheet so that the sixth surface and the seventh surface are faced with each other;

connecting the second portion of the heat-radiation sheet to the second region of each of the chip regions; and dicing the wafer to form individual semiconductor packages after the first semiconductor chip, the heat-radiation sheet and the second semiconductor chip are mounted.

Preferably, the step for preparing the heat-radiation sheet comprises:

preparing the first insulating layer, having a third portion corresponding to the first portion of the heat-radiation sheet and a fourth portion corresponding to the second portion of the heat-radiation sheet;

forming the heat-transferable conductive layer on the first insulating layer;

forming a second through hole passing through the third portion and the heat-transferable conductive layer;

forming a second insulating layer, which covers an inner side surface of the second through hole and the heat-transferable conductive layer;

forming the projected member on the second insulating layer of the fourth portion;

forming a first conductive layer extending between the first insulating layer and the second insulating layer via the second through hole after forming the second insulating layer, so that the third through electrode having the second through hole and the first conductive layer is formed.

According to still another aspect of the present invention, a method for fabricating a semiconductor package, comprising:

preparing a wafer having a plurality of chip regions arranged in matrix, each of which comprises a first surface having a first region and a second region surrounding the first region, a second surface opposing to the first surface, and a first through electrode extending between the first surface and the second surface;

mounting a first semiconductor chip, comprising a third surface, a fourth surface opposing to the third surface and a second through electrode, extending between the third surface and the fourth surface, on the first region of each of the chip regions so that the first through electrode is electrically connected to the second through electrode and the first surface of the chip region and the third surface are faced with each other;

preparing a heat-radiation sheet, which comprises a heat-transferable conductive layer, first and second insulating layers formed on fifth surface and sixth surfaces of the heat-transferable conductive layer, a first portion having a third through electrode extending between the fifth and sixth surfaces to be electrically connected to the second through electrode of the first semiconductor chip, and a second portion extending from at least a side of the first portion, wherein a first through hole is formed to extend between the fifth and sixth surfaces at the second portion;

mounting the heat-radiation sheet on the fourth surface of the first semiconductor chip for each chip region so that the fourth surface and the fifth surface are faced with each other;

mounting a second semiconductor chip, which comprises a seventh surface, an eighth surface opposing to the seventh surface and a fourth through electrode, extending between the seventh surface and the eighth surface to be electrically connected to the third through electrode of the heat-radiation sheet, on the first portion of the heat-radiation sheet so that the sixth surface and the seventh surface are faced with each other;

connecting the second portion of the heat-radiation sheet to the second region of each of the chip regions;

sealing or covering the first semiconductor chip, the second semiconductor chip, the heat-radiation sheet and the first surface of the chip region with a sealing member, after the second portion of the heat-radiation sheet is connected to the second region of each chip region; and dicing the wafer to form individual semiconductor packages after the first semiconductor chip, the heat-radiation sheet and the second semiconductor chip are mounted.

Preferably, the step for preparing the heat-radiation sheet comprises:

preparing the first insulating layer, having a third portion corresponding to the first portion of the heat-radiation sheet and a fourth portion corresponding to the second portion of the heat-radiation sheet;

forming the heat-transferable conductive layer on the first insulating layer;

forming a first through hole passing through the fourth portion and the heat-transferable conductive layer;

forming a second through hole passing through the third portion and the heat-transferable conductive layer;

forming a second insulating layer, which covers an inner side surface of the second through hole and the heat-transferable conductive layer;

forming the projected member on the second insulating layer of the fourth portion;

forming a first conductive layer extending between the first insulating layer and the second insulating layer via the second through hole after forming the second insulating layer, so that the third through electrode having the second through hole and the first conductive layer is formed.

DETAILED DISCLOSURE OF THE INVENTION

Figure 1:
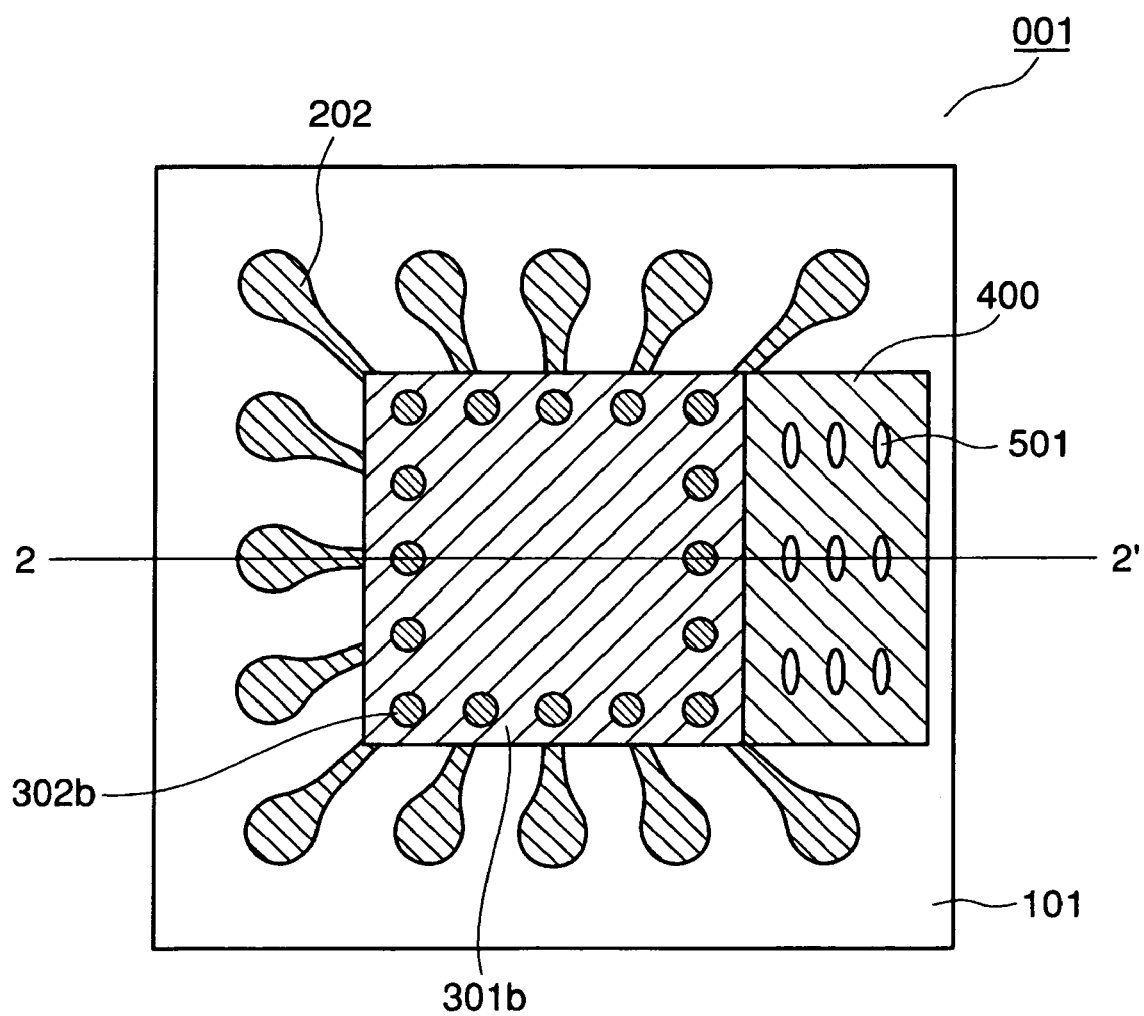
FIG. 1 is a plane view showing the structure of a semiconductor package according to a first preferred embodiment of the present invention.

In the following detailed description of the preferred embodiments, reference is made to the accompanying drawings which form a part thereof, and in which is shown by way of illustration specific preferred embodiments in which the invention may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present invention. The following detailed description is, therefore, not to be taken in a limiting sense, and scope of the present inventions is defined only by the appended claims.

Now, preferred embodiments of the present invention will be described in detail referring to the attached drawings. In the drawings, the same reference symbols are used for the same components.

FIRST PREFERRED EMBODIMENT

Figure 2:
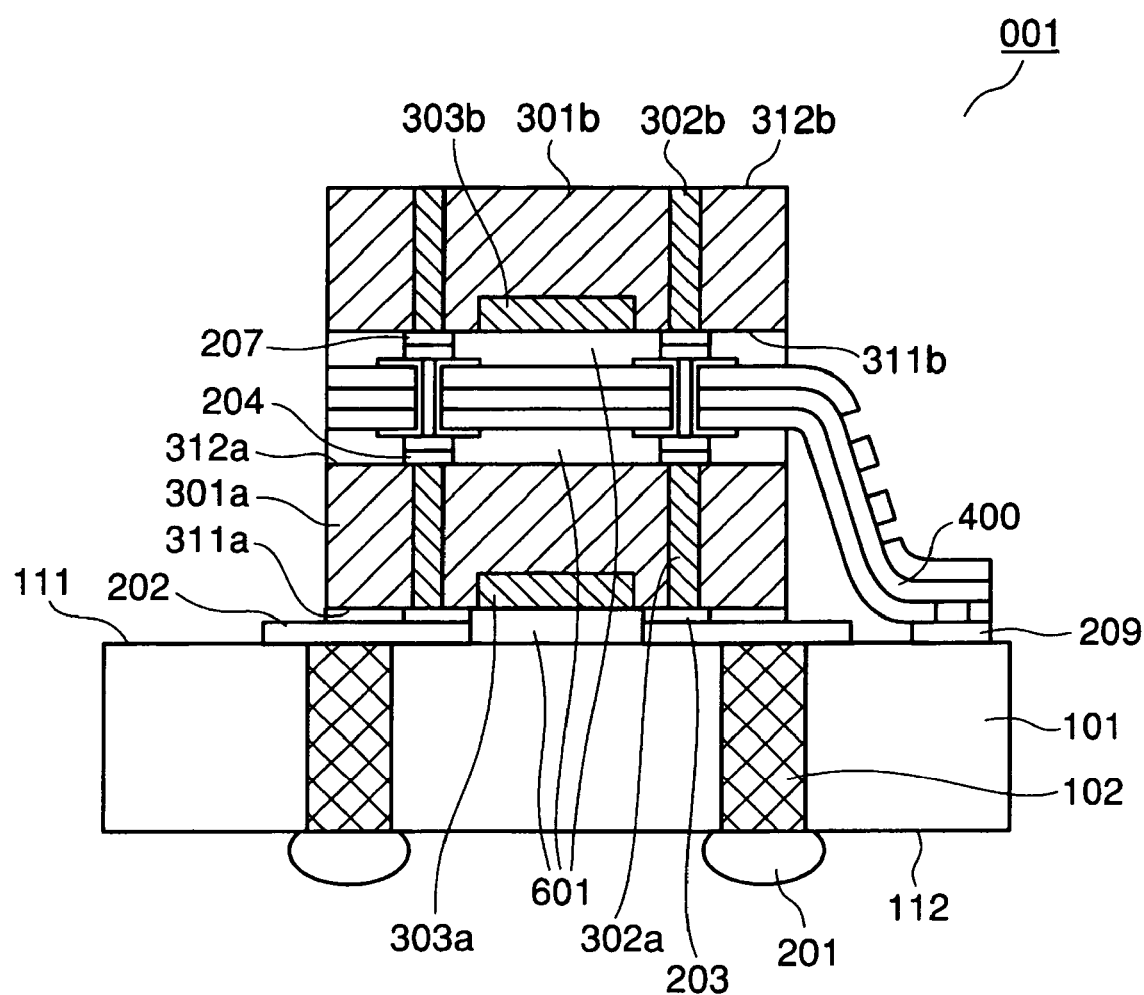
FIG. 2 is a cross-sectional view showing the structure of a semiconductor package according to the first preferred embodiment of the present invention.

FIG. 1 is a plane view illustrating a semiconductor package according to a first preferred embodiment of the present invention; FIG. 2 is a cross-sectional view taken on line 2-2' in FIG. 1; and FIG. 3 is an enlarged view illustrating a heat-radiation sheet.

Figure 3:
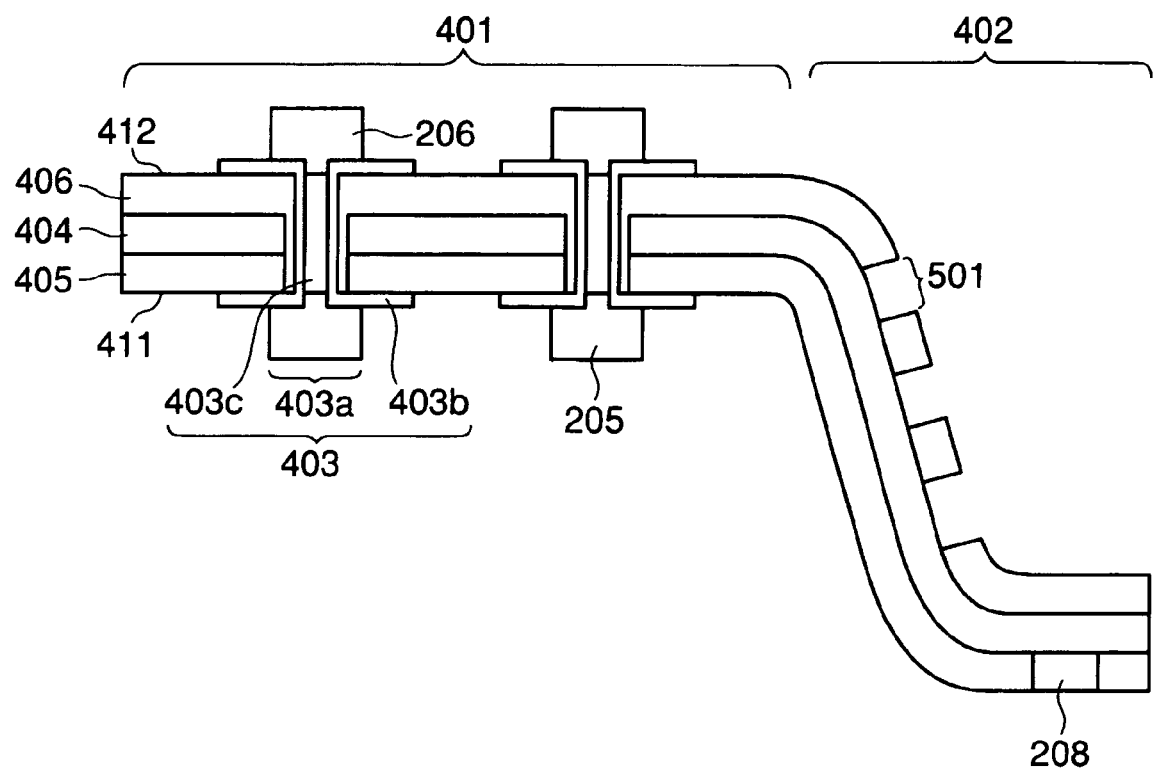
FIG. 3 is an enlarged cross-sectional view of the semiconductor package according to the first preferred embodiment of the present invention.

A semiconductor package 001 according to the first preferred embodiment of the present invention, as shown in FIGS. 1-3, includes a substrate 101 having a first surface 111 and a second surface 112 opposing to the first surface 111; external connection terminals 201 formed on the second surface 112; first and second semiconductor chips 301a and 301b layered or laminated on the first surface of the substrate 101; and a heat-radiation sheet 400. The heat-radiation sheet 400 includes a first portion 401, arranged between the first semiconductor chip 301a and the second semiconductor chip 301b; and a second portion 402, extending at least from one side of the first portion 401 and connected to the substrate 101. Further, the substrate 101 includes first through electrodes 102, which are connected to the external connection terminals 201. The first semiconductor chip 301a includes second through electrodes 302a and a circuit element 303a, wherein the second through electrodes 302a are connected to the first through electrodes 102 via an upper wiring pattern 202 and a contact bump 203. The first portion 401 of the heat-radiation sheet 400 includes third through electrodes 403, which is connected to the second through electrodes 302a via contact bumps 204 and 205. The second semiconductor chip 301b includes fourth through electrodes 302b and a circuit element 303b, wherein the fourth through electrodes 302b are connected to the third through electrodes 402 via contact bumps 206 and 207.

Next, the structure of the heat-radiation sheet according to the present embodiment will be described. The heat-radiation sheet 400 includes, as shown in FIG. 3, a heat transferable conductive layer 404, first insulating layers 405 formed on upper and lower surfaces of the heat transferable conductive layer 404, and a second insulating layer 406. The heat transferable conductive layer 404 may be made of copper. The first and second insulating layers 405 and 406 may be made of polyimide.

The first portion includes the third through electrodes 403, which extend to pass through a fifth surface 411 and a sixth surface 412. The third through electrode 403 includes a second through hole 403a and a first conductive layer 403b, extending between the fifth surface 411 to the sixth surface 412. The arrangement and locations of the first conductive layer 403b formed on the fifth surface 411 and the sixth surface 412 are determined so that the contact bumps 205 and 206 may be formed at desired locations. Further, the third through electrode 403 preferably includes a first conductive member 403c filled in the second through hole 403a, which is covered with the first conductive layer 403b. As a result, a reliability of connection of the third through electrodes 403 can be improved.

The second insulating layer 406 of the second portion 402 is formed so that a part of the heat transferable conductive layer 404 of the second portion 402 is exposed. Hereinafter, for better understanding, that part of the heat transferable conductive layer 404 is called an "exposed portion 501".

The first insulating layer 405 of the second portion 402 is formed so that a part of the heat transferable conductive layer 404 of the second portion 402 is exposed. The exposed part of the first portion 402 is filled with a second conductive material 208, so that the heat transferable conductive layer 404 and the substrate 101 are connected via the second conductive material 208 and second conductive layer 209, formed on the first surface 111 of the substrate 101.

Next, an operation of radiating heat according to the present embodiment will be described. Heat generated at the first semiconductor chip 301a and the second semiconductor chip 301b is transferred via the heat-transferable conductive layer 404 of the first portion 401 of the heat-radiation sheet 400 to the heat-transferable conductive layer 404 of the second portion 402. The heat is then transferred via the conductive material 208 and the second conductive layer 209 to the substrate 101.

The heat is also radiated in the air via the first and second insulating layers 405 and 406 of the second portion 402. Further, since the exposed regions 501 are formed in the second portion 402, the heat is also radiated directly in the air from the heat transferable layer 404, having a high thermal conductivity. Namely, heat generated at the first semiconductor chip 301a and the second semiconductor chip 301b can be transferred and radiated in the air via the heat-transferable conductive layer 404 without passing through the second insulating layer 406. Therefore, heat dissipation characteristic of the semiconductor package 001 is improved, and a reliability of the semiconductor package 001 is also improved.

Next, a modification of a heat-radiation sheet of the first preferred embodiment will be described. A heat-transferable conductive layer 404 of a heat radiation sheet 400 is provided with a wiring pattern. The heat-transferable conductive layer 404 is connected to the third through electrodes 403 and to the first through electrodes 102, so that electric power supply, ground voltage and signals could be transferred via the heat-radiation sheet 400 to the first semiconductor chip 301a and the second conductive chip 301b. The heat radiation sheet 400 can have not only heat radiation function but also wiring function.

Although, according to the present embodiment, the semiconductor package includes one heat-transferable conductive layer 404, preferably, a plurality of heat-transferable conductive layers is used and an insulating layer is formed between adjacent two heat-transferable conductive layers. In this case, a first layer of the heat-transferable conductive layer 404 would be connected to a power supply line, a second layer of the heat-transferable conductive layer 404 would be connected to a ground line and a third layer of the heat-transferable conductive layer 404 would be connected to a signal transmission line. As a result, a specific semiconductor chip could be connected to a desired line for power supply, ground or signal transmission.

Further, according to the present embodiment, when at least a part of the heat-transferable conductive layer 404 of the heat-radiation sheet is grounded, noises generated at the semiconductor chips could be removed. As a result, the layered first and second semiconductor chips 301a and 301b could have the different functions. For example, it could be designed that the first semiconductor chip 301a is a logic circuit, while the second semiconductor chip 301b is a memory device. In this case, since at least a part of the heat-transferable conductive layer 404 is grounded, noises generated at the first and second semiconductor chips 301a and 301b can be removed for each function. As a result, the operation reliability of the semiconductor package 001 can be improved.

Further, although according to the present embodiment, the second portion 402 of the heat-radiation sheet 400 extends from a side of the first portion 401, preferably, the second portions 402 extend from two sides, three or four of the first portion 401. Heat generated at the first semiconductor chip 301a and the second semiconductor chip 301b can be radiated from the second portions 402 of the heat-radiation sheet 400 efficiently.

Further, the second conductive layer 209 is preferably connected to a part of the first through electrode 102 of the substrate 101. According to this structure, heat generated at the first semiconductor chip 301a and the second semiconductor chip 301b can be transferred via the first through electrode 102 to a circuit board efficiently.

Next, components except the heat-radiation sheet 400 will be described.

The substrate 101 includes a first surface 111 and a second surface 112. The first surface includes a first region 111a (FIG. 6(a)), on which the first semiconductor chip 301a is mounted, and a second region 111b (FIG. 6(a)), connected to the heat-radiation sheet 400. The second region 111b surrounds the first region 111a. The substrate 101 is made of the same type of semiconductor material, for example, silicon, as the first semiconductor chip 301a. As a result, coefficients of thermal expansion of the substrate 101 and the first semiconductor chip 301a are identical, and therefore, thermal stress caused by thermal expansion or thermal contraction can be reduced.

The substrate 101 includes first through electrodes 102, which pass through the substrate 101 to reach the first and second surfaces 111 and 112. The first through electrodes 102 are electrically connected to the first semiconductor chip 301a and to the external connection terminals 201.

The upper wiring pattern 202 is formed on the first surface 111 of the substrate 101, wherein the upper wiring pattern 202 connects the first through electrodes 102 and the contact bumps 203. The upper wiring pattern 202 is designed and located so that the contact bumps 203 could be located at desired locations.

The second conductive layer 209 is formed on the second region 111b (FIG. 6(a)) of the first surface 111. Preferably, the second conductive layer 209 is connected to the first through electrodes 102 of the substrate 101, so that the heat-transferable conductive layer 404 and the first through electrodes 102 can be electrically connected to each other.

The external connection terminals 201 are formed on the second surface 112 of the substrate 101, wherein the external connection terminals 201 are connected to the first through electrodes 102. The external connection terminals 201 electrically connect the first through electrodes 102 and an external circuit board when the semiconductor package is mounted on the external circuit board.

The first semiconductor chip 301a is mounted on the first region 111a of the substrate 101 so that a third surface 311a of the first semiconductor chip 301a faces the first surface 111 of the substrate 101. In other words, the third surface 311a of the first semiconductor chip 301a are arranged to be parallel to the first surface 111 of the substrate 101. The first semiconductor chip 301a includes the third surface 311a having a circuit element 303a, a fourth surface 312a opposing to the third surface 311a and a second through electrodes 302a formed inside the semiconductor chip 301a to extend between the third and fourth surfaces 311a and 312a. The second through electrodes 302a is electrically connected to the circuit element 303a. The second through electrodes 302a are made of conductive material, for example, copper, aluminum and poly-silicon.

Lower ends of the second through electrodes 302a of the first semiconductor chip 301a are connected to contact bumps 203, which are to be connected to the upper wiring pattern 202. Upper ends of the second through electrodes 302a of the first semiconductor chip 301a are connected to contact bumps 204, which are to be connected to the contact bumps 205 of the heat-radiation sheet 400. The contact bumps 203 and 204 are made of conductive material, for example, solder, lead-free solder, copper and gold.

The heat-radiation sheet 400 is mounted on the fourth surface 312a of the first semiconductor chip 301a so that a fifth surface 411 of the first portion 401 of the heat-radiation sheet 400 faces the fourth surface 312a of the first semiconductor chip 301a. Lower ends of the third through electrodes 403 of the heat-radiation sheet 400 are connected to contact bumps 205, which are to be connected to the upper wiring pattern 204. Upper ends of the third through electrodes 403 of the third through electrodes 403 are connected to contact bumps 206, which are to be connected to contact bumps 207. The contact bumps 205 and 206 are made of conductive material, for example, solder, lead-free solder, copper and gold in the same manner with the contact bumps 203 and 204.

The second semiconductor chip 301b is mounted on a sixth surface 412 of the first portion 401 of the heat-radiation sheet 400 so that a seventh surface 311b of the second semiconductor chip 301b faces the sixth surface 412 of the heat-radiation sheet 400. The second semiconductor chip 301b is provided with second through electrodes 302b, passing through the semiconductor chip 301b and extending between the fifth surface having a circuit element 303b and the eighth surface 312b. The second through electrodes 302b are electrically connected to the circuit element 303b. The second through electrodes 302b are designed to have the same structure as the first through electrodes 302a of the first semiconductor chip 301a.

A seal layer (member) 601 is formed between the substrate 101 and the first semiconductor chip 301a, between the first semiconductor chip 301a and the first portion 401 of heat-radiation sheet 400 and between the first portion 401 of the heat-radiation sheet 400 and the second semiconductor chip 301b. The seal layer 601 is formed so as to cover the upper wiring pattern 202, sides of the contact bumps 203-208 and the circuit elements 303a and 303b. The seal layer 601 is made of an insulating material, for example, epoxy solid resin and a liquid state of resin. The seal layer 601 reduces a possibility of generation of undesired short circuit at the upper wiring pattern 202, sides of the contact bumps 203-208 and the circuit elements 303a and 303b. Preferably, the seal layer 601 is filled in spaces or rooms formed between the substrate 101 and the first semiconductor chip 301a, between the first semiconductor chip 301a and the first portion 401 of heat-radiation sheet 400 and between the first portion 401 of the heat-radiation sheet 400 and the second semiconductor chip 301b. By filling the above described spaces with the seal material 601, a reflow resistance of the semiconductor package 001 can be improved.

Figure 4:
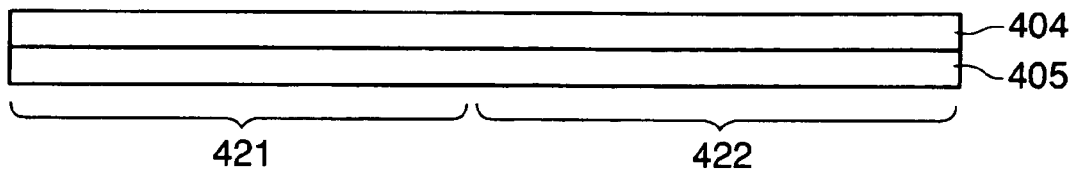
FIG. 4 includes cross-sectional views showing fabrications steps (a)-(c) of the semiconductor package according to the first preferred embodiment of the present invention.
Figure 4:
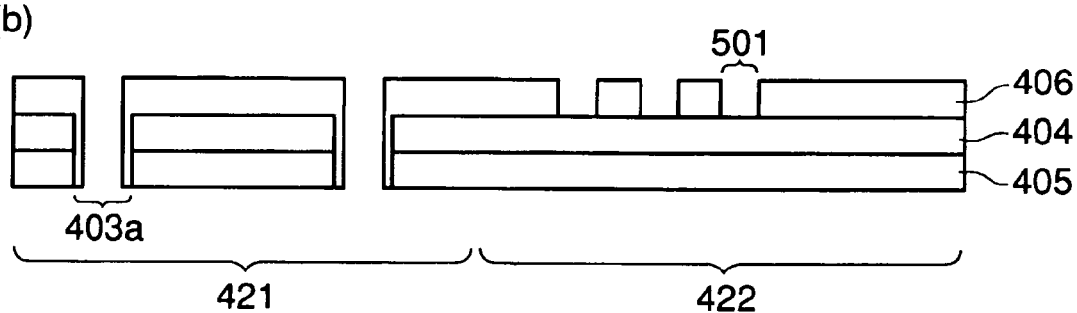
Figure 4:
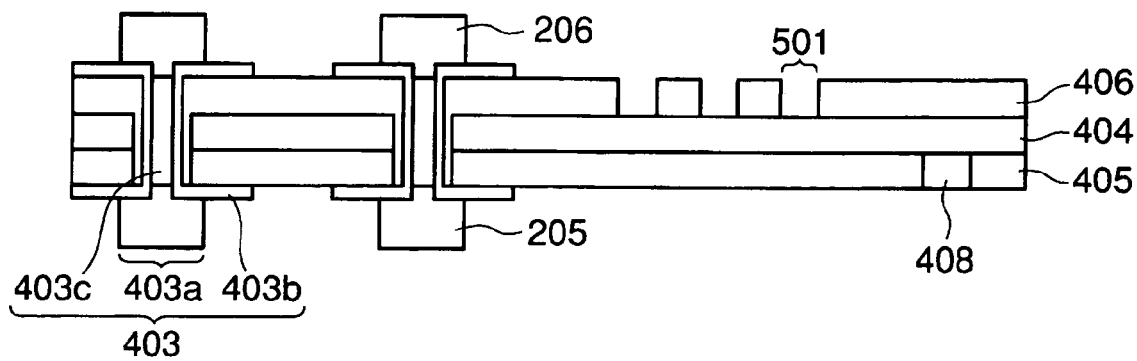
Figure 5:
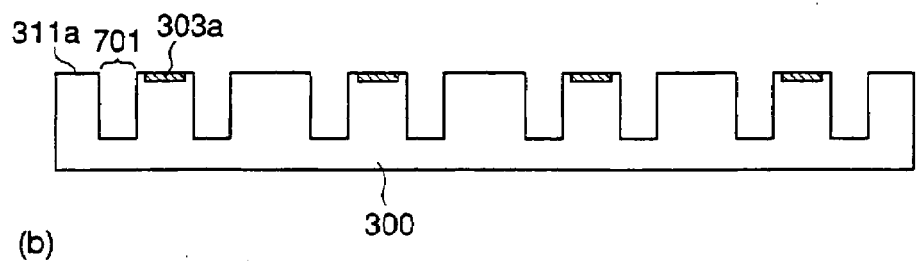
FIG. 5 includes cross-sectional views showing fabrications steps (a)-(e) of the semiconductor package according to the first preferred embodiment of the present invention.
Figure 5:
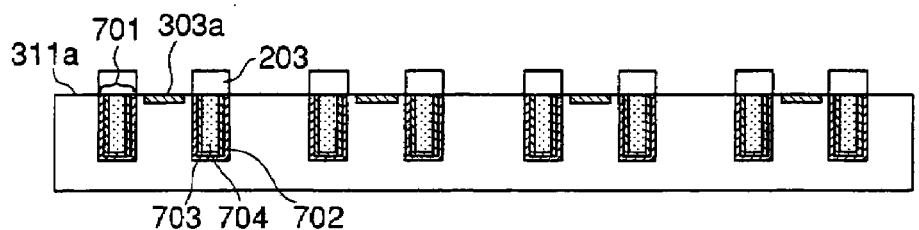
Figure 5:
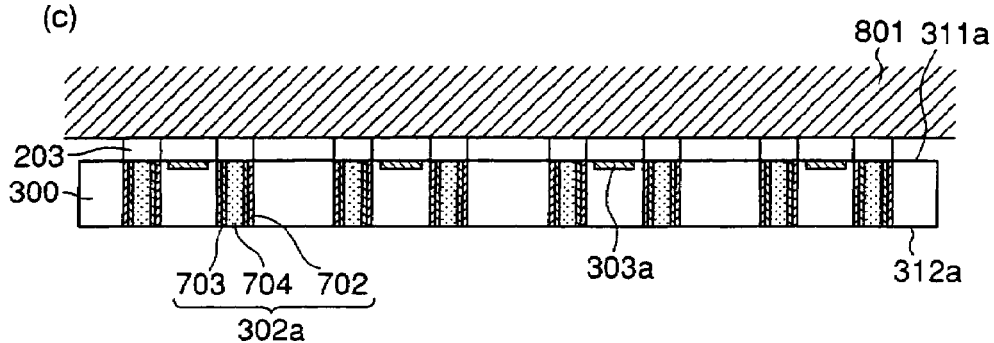
Figure 5:
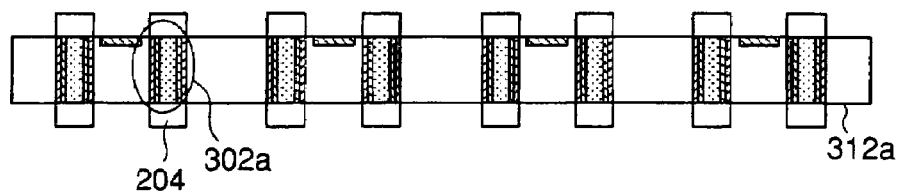
Figure 5:
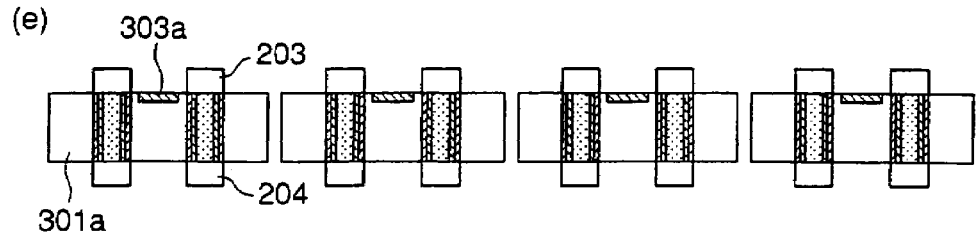
Figure 6:
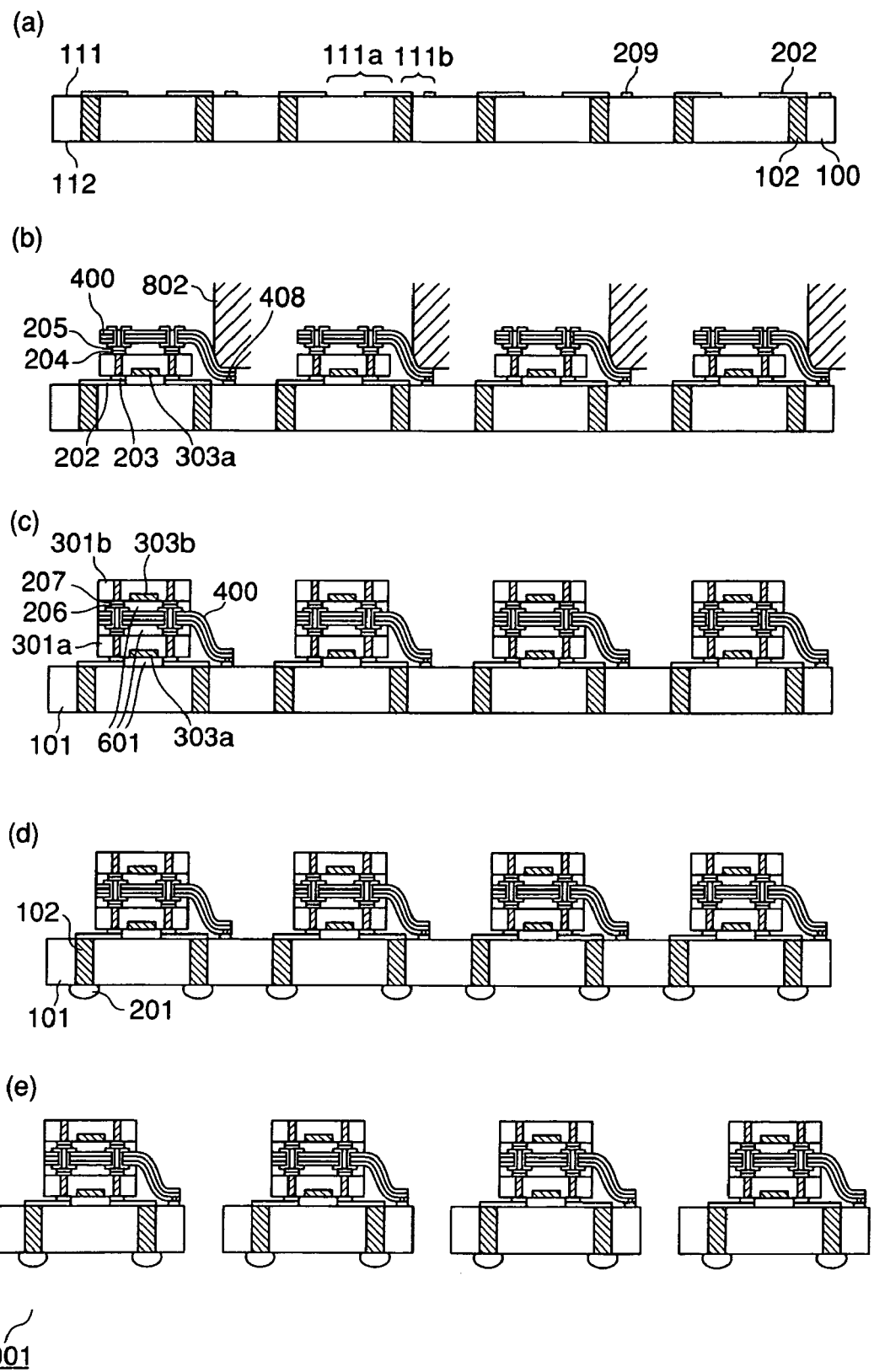
FIG. 6 includes cross-sectional views showing fabrications steps (a)-(e) of the semiconductor package according to the first preferred embodiment of the present invention.

Next, method for fabricating the semiconductor package according to the present embodiment will be described hereinafter. For easy understanding, fabrication steps are classified by first step to third step. In a first step, the heat-radiation sheet 400 is formed. In a second step, the first and second through electrodes 302a and 302b are formed in the first and second semiconductor chips 301a and 301b, respectively; and the contact bumps 203, 204 and 207 are formed. In other words, the second step is a fabrication process carried out until the first and second semiconductor chips 301a and 301b are mounted on the substrate 101. In the third step, the other processes are carried out. The first to third steps are illustrated in FIGS. 4-6, respectively.

First of all, the first step will be described hereinafter. FIG. 4 includes three drawings (a), (b) and (c) of cross-sectional view used for describing fabrication process of the heat-radiation sheet 400. First, as shown in FIG. 4(a), a first insulating layer 405 is prepared. The first insulating layer 405 is made of insulating material, for example, polyimide. The first insulating layer 405 is shaped in accordance with connection with a substrate 101. According to the present embodiment, a second portion 402 extends from a side of a first portion 401 of the heat-radiation sheet 400 and is connected to a second region 111b of the substrate 101. The first insulating layer 405 may be shaped to include a third portion 421, corresponding to the first portion 401, and a fourth portion 422, corresponding to the second portion 402. If the second portions 402 extend from four sides of the first portion 401 of the heat-radiation sheet 400 and is connected to the second region 111b of the substrate 101, the first insulating layer 405 would be shaped to include a third portion 421 corresponding to the first portion 401 of the heat-radiation sheet 400 and fourth portions 422 corresponding to the second portions 402.

Next, a heat-transferable conductive layer 404 is formed on the first insulating layer 405. The heat-transferable conductive layer 404 is made of a conductive material, for example, copper or aluminum. The heat-transferable conductive layer 404 is formed on the insulating layer 405 by a sputtering process. After that, a predetermined wiring pattern can be formed by an etching process at a specific area.

Next, as shown in FIG. 4(b), second through holes (openings) 403a are formed in the third portion 421 of the first insulating layer 405, having the heat-transferable conductive layer 404 thereon. The second through holes 403a are formed by a mechanical manner, for example, punching, or a chemical manner, for example, etching.

Next, inner side surfaces of the second through holes 403a and the heat-transferable conductive layer 404 are covered with a second insulating layer 406. The second insulating layer 406 is made of insulating material, for example, polyimide. The second insulating layer 406 is formed by a printing technique or spin-coating technique. The second insulating layer 406 electrically insulates the heat-transferable conductive layer 404 and third through electrodes 403 from each other.

Next, a part of the heat-transferable conductive layer 404 is exposed by etching selectively the second insulating layer 406, formed on the fourth portion 422 to form exposed regions 501. Heat generated at first and second semiconductor chips 301a and 302a can be radiated in the air directly from the heat-transferable conductive layer 404, having a high thermal conductivity, without via the second insulating layer 406. As a result, heat generated in the semiconductor package can be radiated efficiently and the reliability of the semiconductor package can be improved.

Next, as shown in FIG. 4(c), a first conductive layer 403b is formed on inner side surfaces of the second through holes 403a, covered with the second insulating layer 406, and on the second insulating layer 406. The first conductive layer 403b is formed by sputtering process or CVD (Chemical Vapor Deposition) process. After that, the first conductive layer 403b is etched to be remained on the inner side surfaces of the second through holes 403a, on the first insulating layer 405 and on a surface of the second insulating layer 406. A second through electrode 403 is formed by the second through hole 403a and the first conductive layer 403b.

Next, the first insulating layer 405, formed on the fourth portion 422, is selectively etched so as to expose a part of the heat-transferable conductive layer 404. After that, a second conductive layer 408 is formed on the exposed regions.

Next, contact bumps 205 and 206 are formed on the first conductive layer 403b, formed on the first and second insulating layers 405 and 406. When forming the contact bumps 205 and 206, a photo mask is patterned on a specific area on the first conductive layer 403b by a photo-lithographic process. After that, a conductive layer is formed on the first conductive layer 403b by sputtering, plating process, and the like, and the photo mask is removed.

Preferably, before the first conductive layer 403b is formed, the second insulating layers 406, formed on the inner side surfaces of the second through holes 403a, are etched, so that the heat-transferable conductive layer 404 and the third through electrodes 403 can be electrically connected to each other at desired portions. As a result, predetermined signals can be transmitted via the third through electrodes 403 to the first and second semiconductor chips 301a and 301b.

Further, preferably, a conductive material 403c is filled in the through holes 403a, covered with the first conductive layer 403b, after the first conductive layer 403b is formed. As a result, the reliability of the third through electrodes 43 can be improved.

Next, the second step will be described hereinafter. In the following, only processes for forming second through electrodes 302a and contact bumps 203 and 204 in the first semiconductor chip 301a are described. Processes for forming fourth through electrodes 302b and contact bumps 207 in the second semiconductor chip 301b are omitted to avoid repeating the same or similar descriptions.

First, as shown in FIG. 5(a), a semiconductor wafer 300 having isolated plural circuit element regions is prepared.

Next, grooves 701 are formed on a third surface 311a of the wafer 300, circuit elements 303a being formed on or in the third surface 311a. When forming the grooves 701, a mask is formed on the third surface 311a by a photo-lithography process, and the third surface 311a is dry-etched. For example, the wafer 300 is shaped to have a thickness of 760 μm, while each groove 701 is shaped to have a depth of not less than 100 μm and an inner diameter of 10-20 μm.

Next, as shown in FIG. 5(b), an inner side surface and a bottom surface of each groove 701 are covered with an insulating layer 702. The insulating layer 702 is made of, for example, oxide silicon. The insulating layer 702 may be formed by a CVD process.

Preferably, the inner surface of each groove 701, which is covered with the insulating layer 702, is covered with a fourth conductive layer 703. The fourth conductive layer 703 is made of a conductive material, for example, copper. The fourth conductive layer 703 may be formed by a CVD process to be a base layer of a second conductive layer 704, which is formed by an electric plating process.

Next, a second conductive member 704 is filled in each of the grooves 701, covered with the insulating layer 702 and fourth conductive layer 703. The second conductive member 704 is made, for example, of copper, aluminum or polysilicon. When forming the second conductive member 704, a mask is patterned on the third surface 311a by a photo-lithographic process, the second conductive member 704 is filled in the grooves 701 by an electric plating process. In the other method, a conductive material is deposited over the third surface 311a, and the deposited conductive material is polished by a CMP (Chemical Mechanical Polishing) process until the third surface 311a is exposed.

Next, a wiring pattern (not shown) is formed on the third surface 311a so that the wiring pattern electrically connects the second conductive member 704 in the grooves 701 and the circuit elements 303a with each other. In the process for forming the wiring pattern, a conductive layer, for example, copper or aluminum, is deposited on the third surface 311a by a CVD process; and patterning the deposited conductive layer by a photo-lithographic process. Preferably, in the process for forming the circuit elements 303a, electrode pads are formed; and the grooves 701, the insulating layer 702, the conductive layer 703 and the second conductive member 704 are formed at the electrode pads. As a result, it is unnecessary to form a wiring pattern after the second conductive member 704 is formed.

Next, contact bumps 203 are formed on the third surface 311a so that the second conductive members 704 in the grooves 701 are connected to the contact bumps 203. When forming the contact bumps 203, a mask is patterned on the third surface 311a; a conductive material is formed on the second conductive members 704 by a sputtering process or plating process; and the mask is removed.

Next, as shown in FIG. 5(c), the contact bumps 203 are supported or fixed to a support table 801, a fourth surface 312a of the semiconductor wafer 300 is polished until the second conductive members 704 are exposed. The polishing process is carried out, for example, by a CVD manner. When the second conductive members 704, formed in the grooves 701, are exposed, second through electrodes 302a are formed (completed). The second through electrodes 302a can be formed within a semiconductor process as well as the circuit elements 303a, so that fabrication cost for forming the second through electrodes 302a may be reduced. Preferably, the polishing process is carried out so that the semiconductor wafer 300 has a thickness of 20-100 μm when dicing it. As a result, the semiconductor chip 301a is prevented from being broken, the semiconductor chip 301a could be shaped to have a small thickness, and therefore, packaging density of the semiconductor package 001 could be improved.

Next, as shown in FIG. 5(d), contact bumps 204 are formed on the fourth surface 312a of the semiconductor wafer 300 so that the contact bumps 204 are connected to the second through electrodes 302a. The contact bumps 204 can be formed in the same manner with the contact bumps 203.

Finally, as shown in FIG. 5(e), the semiconductor wafer 300 having a plurality of chip regions is diced for each chip region to form individual semiconductor chips 301a, each having the contact bumps 203 and 204.

According to the above-described first step, the fourth surface 312a is polished after the contact bumps 203 are formed on the third surface 311a, and then, the contact bumps 204 are formed on the fourth surface 312a. The contact bumps 203 and 204 may be formed on the third and fourth surfaces 311a and 312a, respectively, after the fourth surface 312a is polished. The circuit elements 303a may be formed on any of the third surface 311a and the fourth surface 312a of the semiconductor wafer 300, because the first semiconductor chip 301a is to be connected via the second through electrodes 302a to a second semiconductor chip 301b and a substrate 101.

Next, the second step for fabricating the semiconductor package 001 according to the present embodiment will be described.

First, as shown in FIG. 6(a), a semiconductor wafer 100, having a first surface 111 and a second surface 112, is prepared. The first surface 111 includes a first region 111a, on which the first semiconductor chip 301a is to be mounted, and a second region 111b, to be connected to a heat-radiation sheet 400. The semiconductor wafer 100 also includes first through electrodes 102, extending vertically in the semiconductor wafer 100 between the first surface 111 and the second surface 112. A plurality of chip regions is formed in matrix manner on the semiconductor wafer 100. The first through electrodes 102 may be formed in the same manner with the second through electrodes 302a in the semiconductor wafer 300.

Next, an upper wiring 202 and a second conductive layer 209 are formed on the first surface 111 of the semiconductor wafer 100 for each chip region. When forming the upper wiring 202 and the second conductive layer 209, a conductive layer is sputtered on the first surface 111 of the semiconductor wafer 100, and then, the conductive layer is patterned by a photo-lithographic process.

Next, as shown in FIG. 6(b), the first semiconductor chip 301a is mounted on each of the first regions 111a of the semiconductor wafer 100. At this time, the upper wiring 202 and the contact bumps 203 are connected to each other.

Next, a heat-radiation sheet 400 is mounted on the first semiconductor chip 301a so that contact bumps 205 of the heat-radiation sheet 400 are connected to contact bumps 204 of the first semiconductor chip 301a. Second conductive member 408 of the heat-radiation sheet 400 is connected to second conductive layer 209 (FIG. 2) of the substrate 101 by pressing the heat-radiation sheet 400 downwardly with a bonding tool 802.

Next, as shown in FIG. 6(c), a second semiconductor chip 301b is mounted on the heat-radiation sheet 400 so that contact bumps 206 of the heat-radiation sheet 400 and the contact bumps 207 of the second semiconductor chip 301b are connected to each other.

Next, a sealing material is poured or filled from sides of the semiconductor wafer 100, the first semiconductor chip 301a, the heat-radiation sheet 400 and the second semiconductor chip 301b into spaces formed between the wafer 100 and the first semiconductor chip 301a, between the first semiconductor chip 301a and the heat-radiation sheet 400 and between the heat radiation sheet 400 and the second semiconductor chip 301b to form a sealing layer 601. The sealing material may be poured or filled after the entire of the first semiconductor chip 301a, the heat-radiation sheet 400 and the second semiconductor chip 301b are mounted on the wafer 100. The sealing material may also be poured or filled at a plurality of times while the first semiconductor chip 301a, the heat-radiation sheet 400 and the second semiconductor chip 301b are layered and connected on the wafer 100.

Next, as shown in FIG. 6(d), outer contact terminals 201 are formed on the second surface 112 of the semiconductor wafer 100 so that the outer contact terminals 201 are connected to the first through electrodes 102 of the substrate 101.

Lastly, as shown in FIG. 6(e), the semiconductor wafer 100 is diced by a mechanical process to form individual semiconductor packages (apparatus) 001.

SECOND PREFERRED EMBODIMENT

Figure 7:
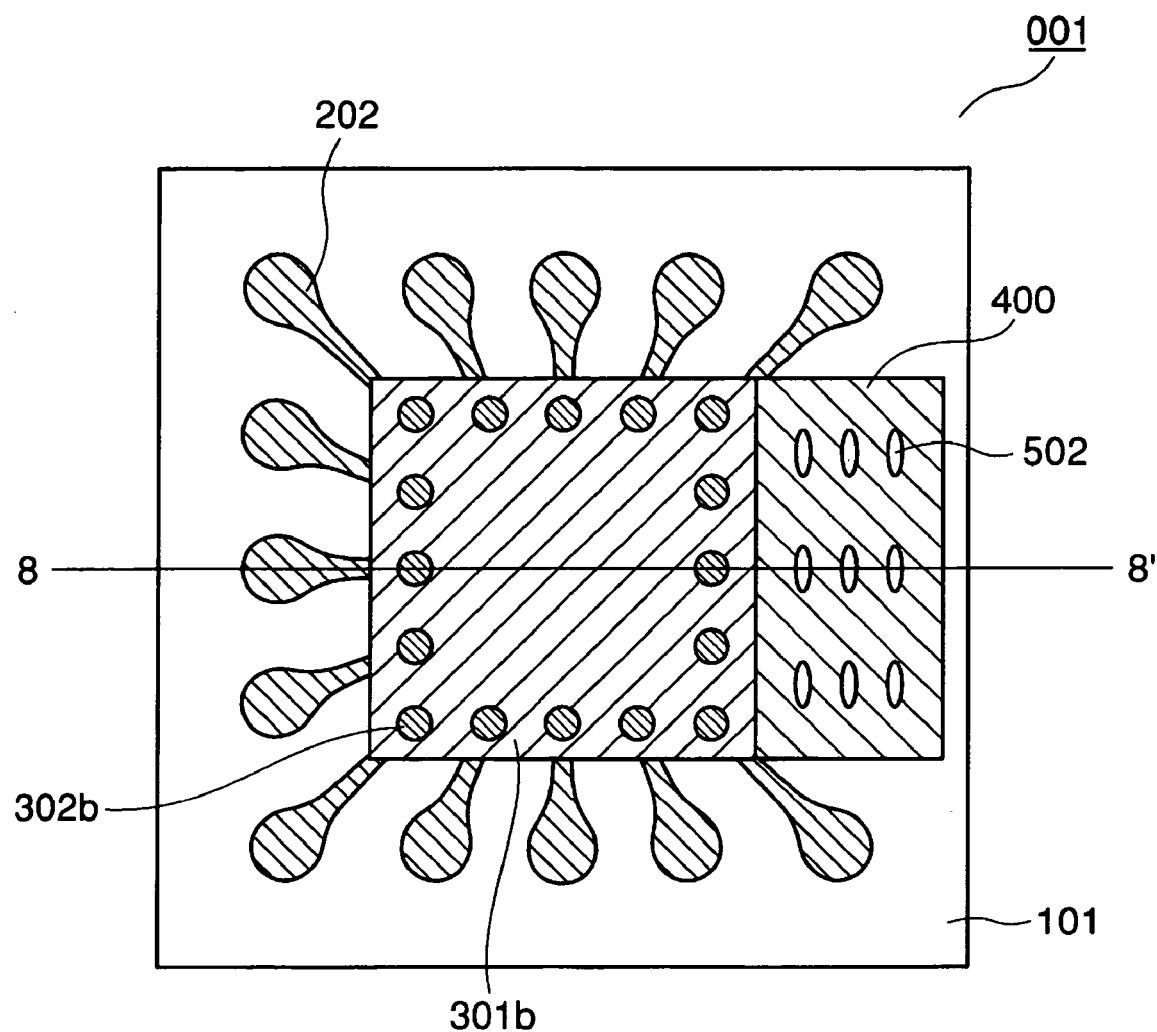
FIG. 7 is a plane view showing the structure of a semiconductor package according to a second preferred embodiment of the present invention.
Figure 8:
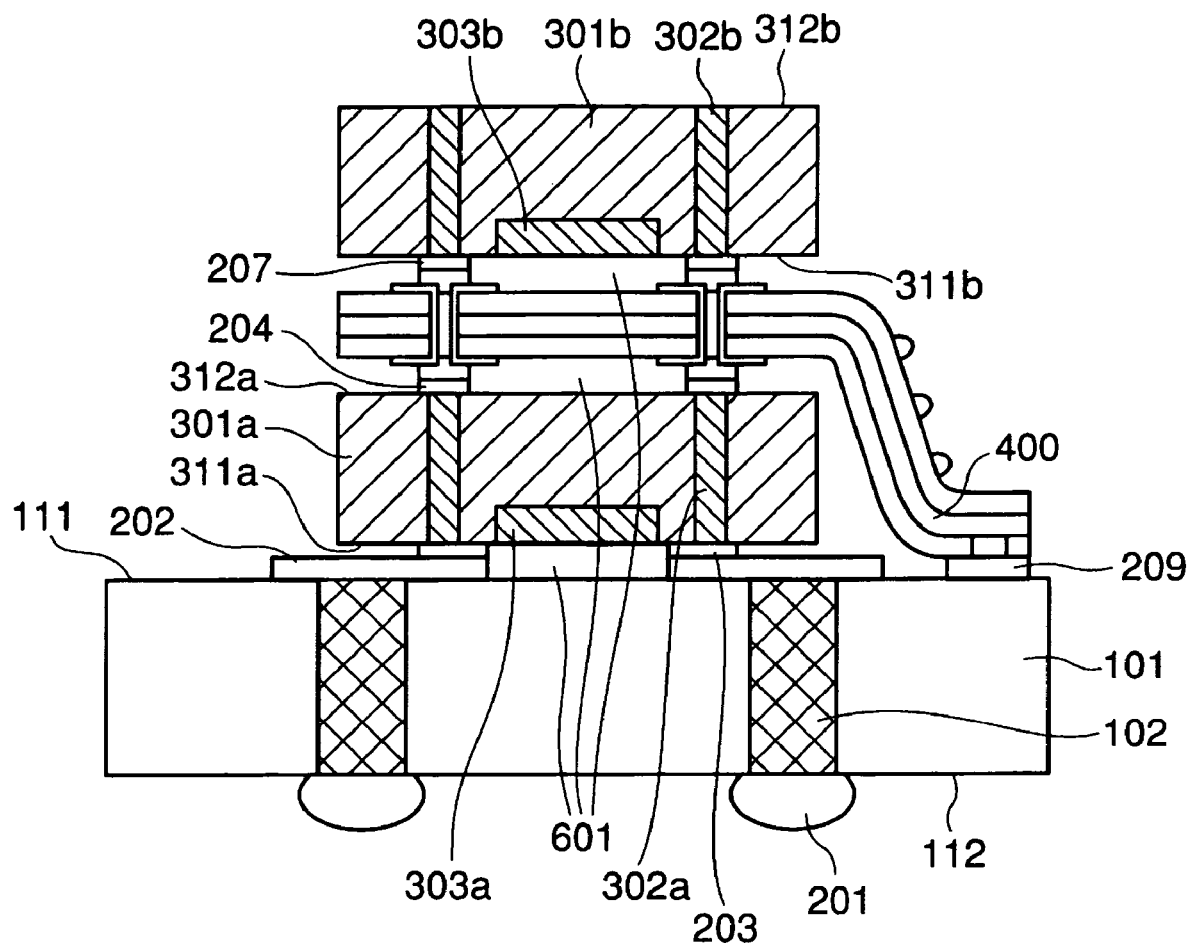
FIG. 8 is a cross-sectional view showing the structure of a semiconductor package according to the second preferred embodiment of the present invention.

FIG. 7 is a plane view illustrating a semiconductor package according to a second preferred embodiment of the present invention; FIG. 8 is a cross-sectional view taken on line 8-8' in FIG. 7; and FIG. 9 is an enlarged view illustrating a heat-radiation sheet.

Figure 9:
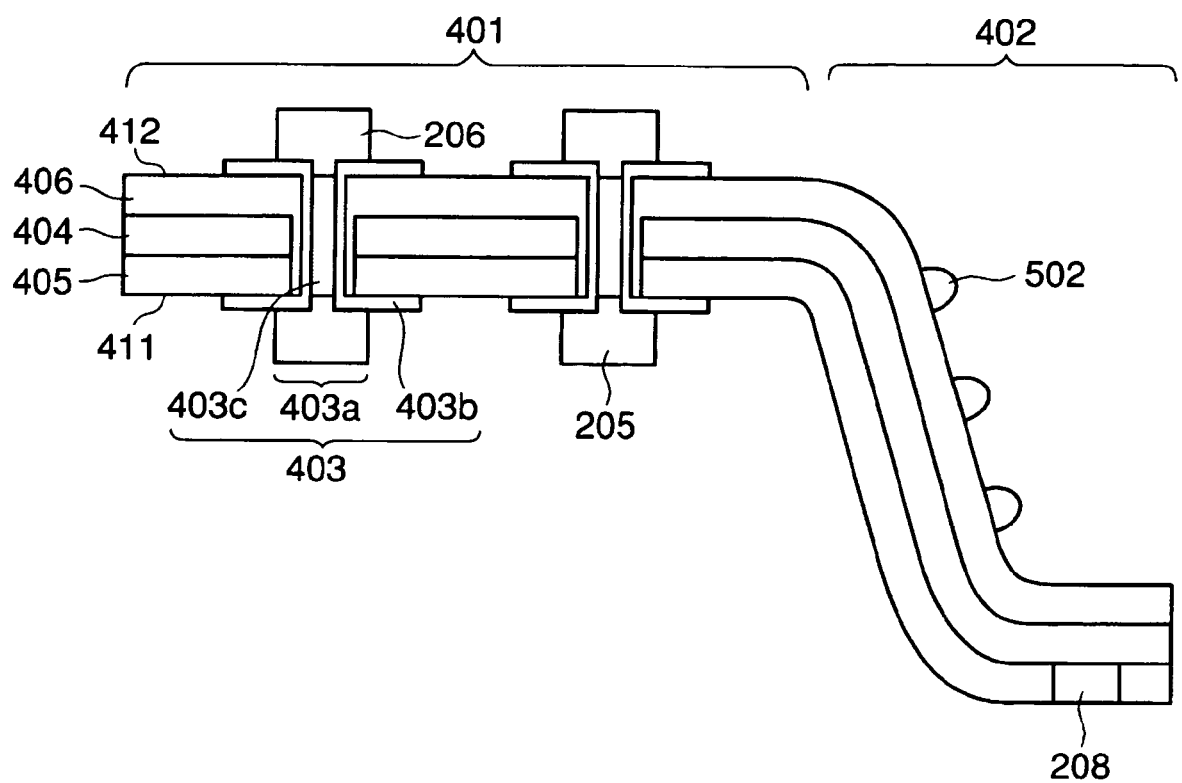
FIG. 9 is an enlarged cross-sectional view of the semiconductor package according to the second preferred embodiment of the present invention.

A semiconductor package 001 according to the second preferred embodiment of the present invention, as shown in FIGS. 7-9, includes a substrate 101 having a first surface 111 and a second surface 112 opposing to the first surface 111; external connection terminals 201 formed on the second surface 112; first and second semiconductor chips 301a and 301b layered or laminated on the first surface of the substrate 101; and a heat-radiation sheet 400. The heat-radiation sheet 400 includes a first portion 401, arranged between the first semiconductor chip 301a and the second semiconductor chip 301b; and a second portion 402, extending at least from one side of the first portion 401 and connected to the substrate 101. Further, the substrate 101 includes first through electrodes 102, which are connected to the external connection terminals 201. The first semiconductor chip 301a includes second through electrodes 302a and a circuit element 303a, wherein the second through electrodes 302a are connected to the first through electrodes 102 via an upper wiring pattern 202 and a contact bump 203. The first portion 401 of the heat-radiation sheet 400 includes third through electrodes 403, which is connected to the second through electrodes 302a via contact bumps 204 and 205. The second semiconductor chip 301b includes fourth through electrodes 302b and a circuit element 303b, wherein the fourth through electrodes 302b are connected to the third through electrodes 402 via contact bumps 206 and 207.

Next, the structure of the heat-radiation sheet according to the present embodiment will be described.

As shown in FIG. 9, the heat radiation sheet 400 includes a heat transferable conductive layer 404, first insulating layers 405 formed on upper and lower surfaces of the heat transferable conductive layer 404, and a second insulating layer 406. Projected members 502 are formed on the second insulating layer 406 in the second portion 402 of the heat-radiation sheet 400. The projected members 502 are made of an insulating material. The other structure of the heat-radiation sheet 400 is the same or similar as that of the first preferred embodiment.

Next, an operation of radiating heat according to the present embodiment will be described. Heat generated at the first semiconductor chip 301a and the second semiconductor chip 301b is transferred via the heat-transferable conductive layer 404 of the first portion 401 of the heat-radiation sheet 400 to the heat-transferable conductive layer 404 of the second portion 402. The heat is then transferred via the conductive material 208 and the second conductive layer 209 to the substrate 101.

The heat is also radiated in the air via the first and second insulating layers 405 and 406 of the second portion 402.

Further, heat generated at the first semiconductor chip 301a and the second semiconductor chip 301b is radiated from the projected members 502 in the second portion 402 of the heat-radiation sheet 400. The projected members 502 enlarges a surface area of the second insulating layer 406, from which heat generated at the first semiconductor chip 301a and the second semiconductor chip 301b is radiated. Therefore, heat dissipation characteristic of the semiconductor package 001 is improved, and a reliability of the semiconductor package 001 is also improved. All the components and structure except the heat-radiation sheet 400 are the same or similar as those of the first preferred embodiment.

Next, method for fabricating the semiconductor package according to the present embodiment will be described hereinafter. The fabrication processes corresponding to the second step according to the first preferred embodiment is applicable to the second preferred embodiment as well. In the second step according to the first preferred embodiment, the first and second through electrodes 302a and 302b are formed in the first and second semiconductor chips 301a and 301b, respectively; and the contact bumps 203, 204 and 207 are formed. In other words, the second step is a fabrication process carried out until the first and second semiconductor chips 301a and 301b are mounted on the substrate 101. The third step according to the first preferred embodiment is also applicable to the second preferred embodiment. Hereinafter, fabrication processes for forming the heat-radiation sheet 400 are only described, because the structure of the heat-radiation sheet 400 is a major feature of the second preferred embodiment.

Figure 10:
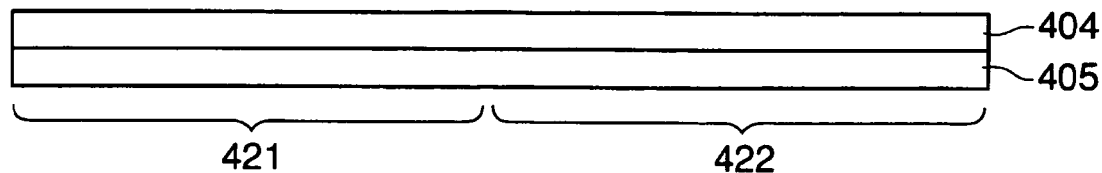
FIG. 10 includes cross-sectional views showing fabrications steps (a)-(c) of the semiconductor package according to the second preferred embodiment of the present invention.
Figure 10:
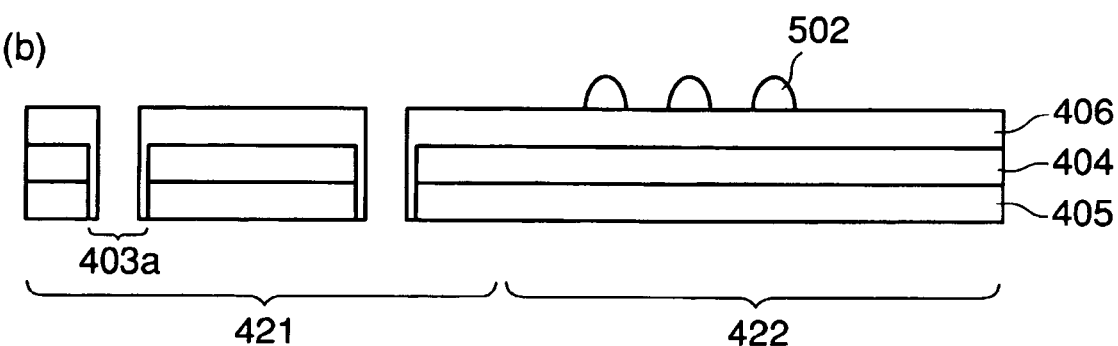
Figure 10:
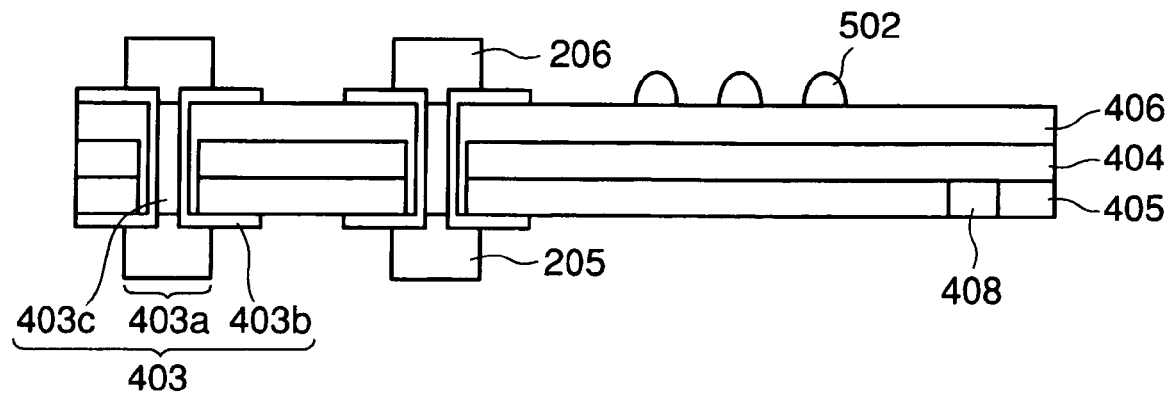

First of all, a first step will be described hereinafter. FIG. 10 includes three drawings (a), (b) and (c) of cross-sectional view used for describing fabrication process of the heat-radiation sheet 400. First, as shown in FIG. 10(a), a first insulating layer 405 is prepared. The first insulating layer 405 corresponds to that in the first preferred embodiment and the same structure is applicable. Next, a heat-transferable conductive layer 404 is formed on the first insulating layer 405. The same or similar fabrication processes of the heat-transferable conductive layer 404 according to the first preferred embodiment are applicable to the second preferred embodiment.

Next, as shown in FIG. 10(b), second through holes (openings) 403a are formed in the third portion 421 of the first insulating layer 405, having the heat-transferable conductive layer 404 thereon. The same or similar fabrication processes of the second through holes 403a according to the first preferred embodiment are applicable to the second preferred embodiment.

Next, inner side surfaces of the second through holes 403a and the heat-transferable conductive layer 404 are covered with a second insulating layer 406. The same or similar fabrication processes of the second insulating layer 406 according to the first preferred embodiment are applicable to the present embodiment.

Next, as shown in FIG. 10(c), a first conductive layer 403b is formed on inner side surface of the second through hole 403a, covered with the second insulating layer 406, on the first insulating layer 405 in the first portion 401 and on a part of the second insulating layer 406 in the first portion 401. The fabrication processes of the first conductive layer 403b according to the first preferred embodiment are applicable to the present embodiment.

Next, projected members 502 are formed on the second insulating layer in the second portion 402 of the heat-radiation sheet 400. Heat generated at the first semiconductor chip 301a and the second semiconductor chip 301b is radiated in the air from the second insulating layer 406, a surface area of which is substantially enlarged by the projected members 502.

Next, the first insulating layer 405, formed on the fourth portion 422, is selectively etched so as to expose a part of the heat-transferable conductive layer 404. After that, a second conductive layer 408 is formed on the exposed regions.

Next, contact bumps 205 and 206 are formed on the first conductive layer 403b, formed on the first and second insulating layers 405 and 406. Fabricating process of the contact bumps 205 and 206 according to the first preferred embodiment are applicable to the present embodiment.

A semiconductor package 001 according to the present embodiment can be fabricated with the above described heat-radiation sheet 400 and the other components, corresponding to the first preferred embodiment.

THIRD PREFERRED EMBODIMENT

Figure 11:
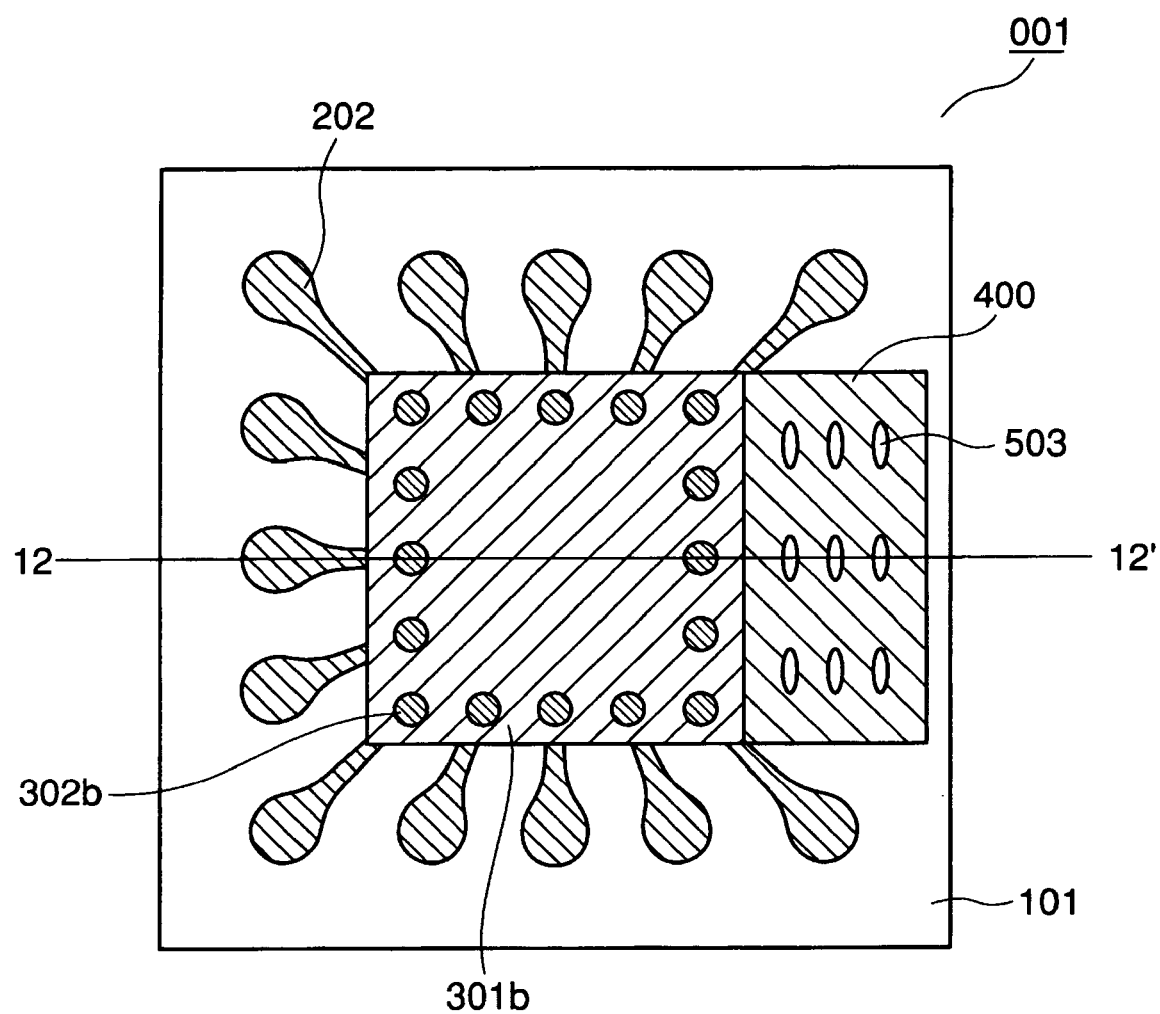
FIG. 11 is a plane view showing the structure of a semiconductor package according to a third preferred embodiment of the present invention.
Figure 12:
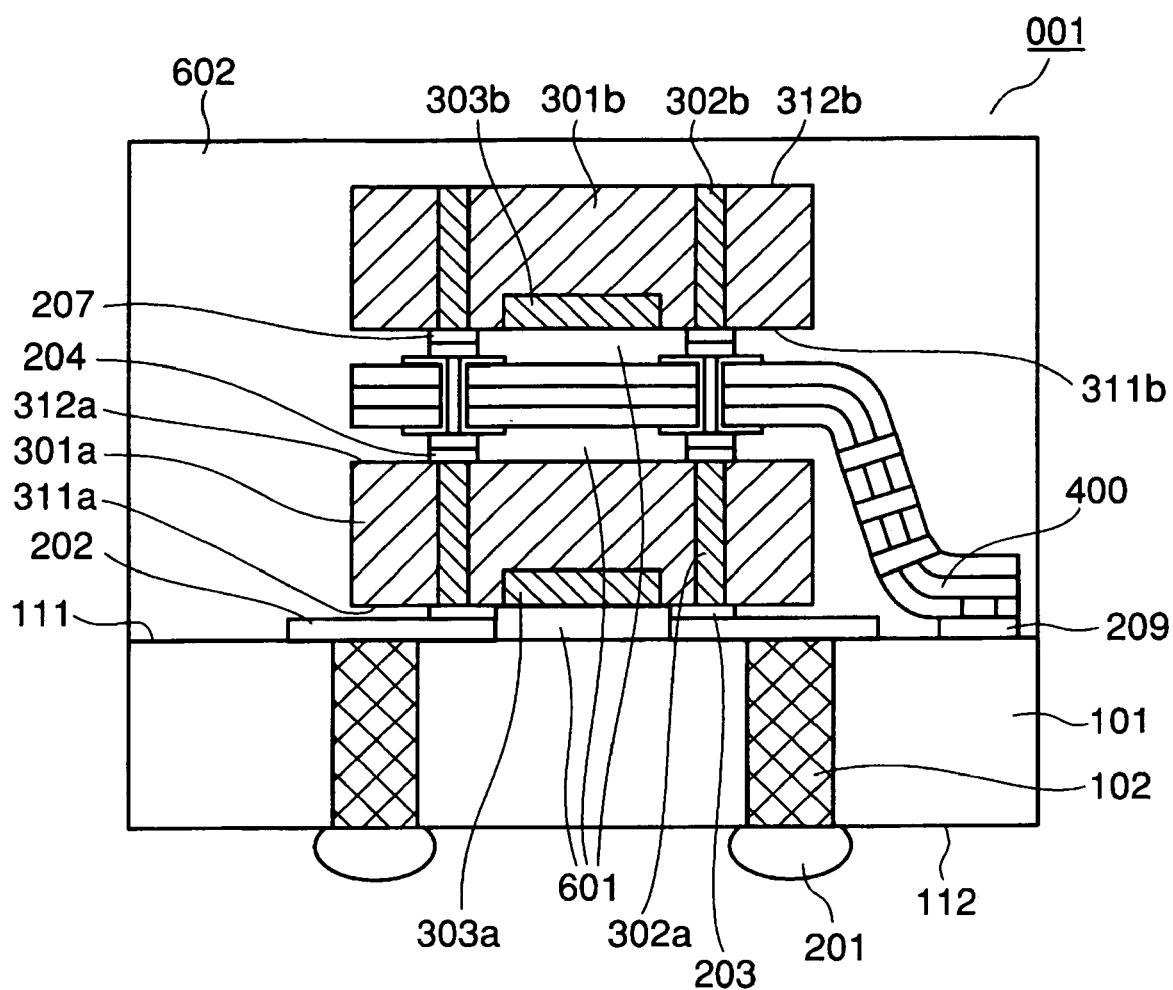
FIG. 12 is a cross-sectional view showing the structure of a semiconductor package according to the third preferred embodiment of the present invention.

FIG. 11 is a plane view illustrating a semiconductor package according to a third preferred embodiment of the present invention; FIG. 12 is a cross-sectional view taken on line 11-11' in FIG. 11; and FIG. 13 is an enlarged view illustrating a heat-radiation sheet 400.

Figure 13:
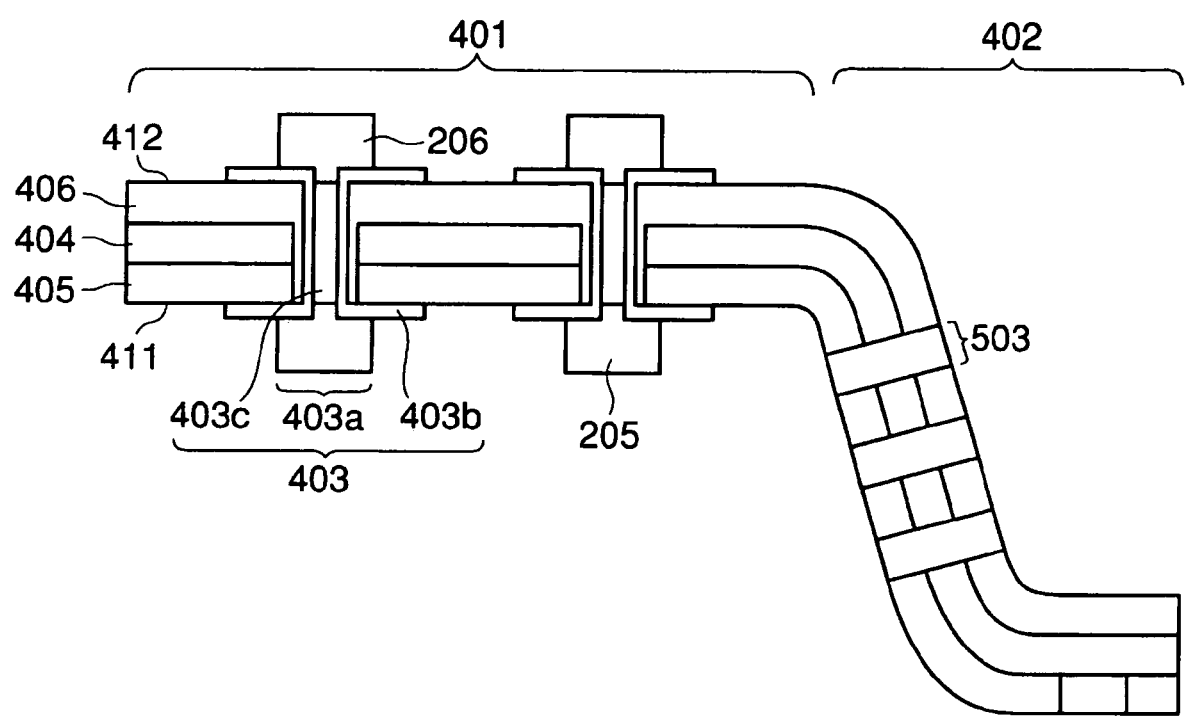
FIG. 13 is an enlarged cross-sectional view of the semiconductor package according to the third preferred embodiment of the present invention.

A semiconductor package 001 according to the third preferred embodiment of the present invention, as shown in FIGS. 11-13, includes a substrate 101 having a first surface 111 and a second surface 112 opposing to the first surface 111; external connection terminals 201 formed on the second surface 112; first and second semiconductor chips 301a and 301b layered or laminated on the first surface of the substrate 101; and a heat-radiation sheet 400. The heat-radiation sheet 400 includes a first portion 401, arranged between the first semiconductor chip 301a and the second semiconductor chip 301b; and a second portion 402, extending at least from one side of the first portion 401 and connected to the substrate 101. Further, the substrate 101 includes first through electrodes 102, which are connected to the external connection terminals 201. The first semiconductor chip 301a includes second through electrodes 302a and a circuit element 303a, wherein the second through electrodes 302a are connected to the first through electrodes 102 via an upper wiring pattern 202 and a contact bump 203. The first portion 401 of the heat-radiation sheet 400 includes third through electrodes 403, which is connected to the second through electrodes 302a via contact bumps 204 and 205. The second semiconductor chip 301b includes fourth through electrodes 302b and a circuit element 303b, wherein the fourth through electrodes 302b are connected to the third through electrodes 402 via contact bumps 206 and 207. The semiconductor package 001 further includes a sealing member 602 which covers a first surface 111 of the substrate 100, the first semiconductor chip 301a, the heat-radiation sheet 400 and the second semiconductor chip 301b.

Next, the structure of the heat-radiation sheet 400 according to the present embodiment will be described.

As shown in FIG. 13, the heat radiation sheet 400 includes a heat transferable conductive layer 404, first insulating layers 405 formed on upper and lower surfaces of the heat transferable conductive layer 404, and a second insulating layer 406.

The second portion of the heat-radiation sheet 400 includes a fifth surface 411, a sixth surface 412 and first through holes 503 extending vertically between the fifth and sixth surfaces 411 and 412. Since the heat-radiation sheet 400 has flexibility, the heat-radiation sheet 400 may be broken when the seal member is formed. However, according to the present embodiment, pressure applied to the heat-radiation sheet 400 can be reduced by the first through holes 503. As a result, the heat-radiation sheet 400 could be mounted in the semiconductor package 001 without decreasing heat-radiation characteristic. The number, shape and locations of the first through holes 503 are determined based on the pressure, applied to the heat-radiation sheet 400 in a sealing or molding process. The other structure of the heat-radiation sheet 400 is the same or similar as that of the first preferred embodiment.

Next, an operation of radiating heat according to the present embodiment will be described. Heat generated at the first semiconductor chip 301a and the second semiconductor chip 301b is transferred via the heat-transferable conductive layer 404 of the first portion 401 of the heat-radiation sheet 400 to the heat-transferable conductive layer 404 of the second portion 402. The heat is then transferred via the conductive material 208 and the second conductive layer 209 to the substrate 101.

The heat is also transferred via the first and second insulating layers 405 and 406 of the second portion 402 to the seal member 602.

Since the second portion 402 of the heat-radiation sheet 400 is provided with the first through holes 503, possibility of brake of the heat-radiation sheet 400 when the seal member is formed is reduced. Even if a seal member 602 is formed, heat generated at the first semiconductor chip 301a and the second semiconductor chip 301b could be transferred via the second insulating layer 406 and the seal member 602 to the substrate 101. As a result, even if a seal member 602 is used, heat-radiation characteristic of the semiconductor package 001 is not degraded.

Next, components except the heat-radiation sheet 400 are described.

As shown in FIG. 12, a sealing member 602 is formed around the first surface 111 of the substrate 101, the first semiconductor chip 301a and the second semiconductor chip 301b so that the sealing member 602 covers at least the first semiconductor chip 301a, second semiconductor chip 301b, first surface 111 and the upper wiring pattern 202. The sealing member is made of an insulating material, for example, an epoxy resin. Further, the sealing member 602 is formed at spaces where sealing layers 601 are not formed sufficiently, so that a reflow resistance of the semiconductor package 001 could be improved. The sealing layers 601 seal a space between the substrate 101 and the first semiconductor chip 301a, a space between the first semiconductor chip 301a and the first portion 401 of the heat-radiation sheet 400 and a space between the first portion of the heat-radiation sheet 400 and the second semiconductor chip 301b.

Preferably, the sealing member 602 made of a material including ceramics to improve a heat radiation characteristic of the semiconductor package 001.

The other components and structures except the sealing member 602 are the same as those in the first preferred embodiment.

Figure 14:
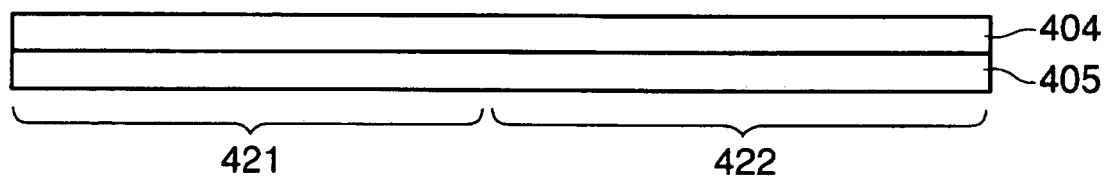
FIG. 14 includes cross-sectional views showing fabrications steps (a)-(c) of the semiconductor package according to the third preferred embodiment of the present invention.
Figure 14:
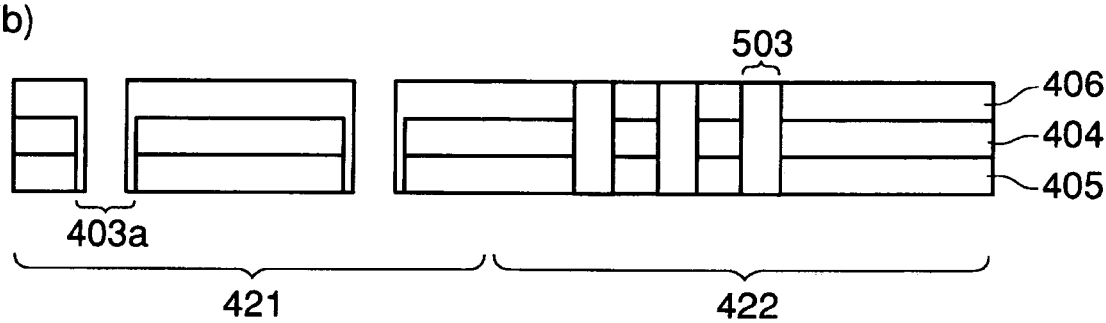
Figure 14:
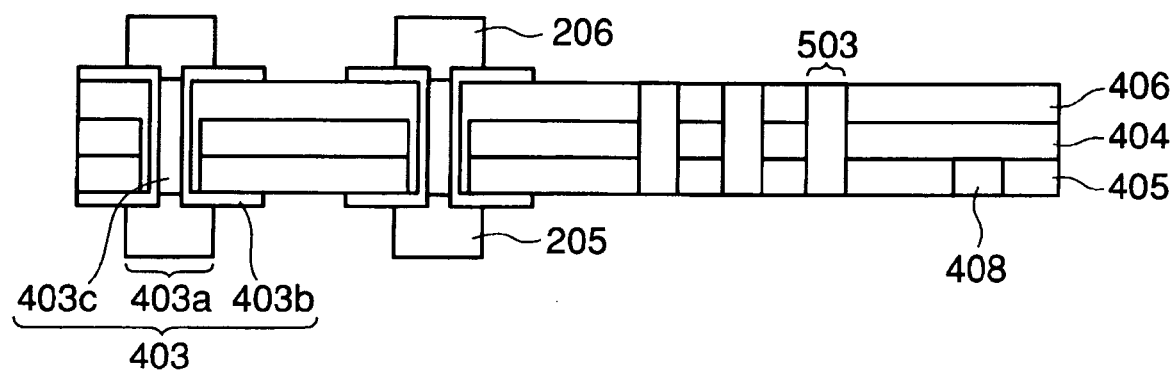
Figure 15:
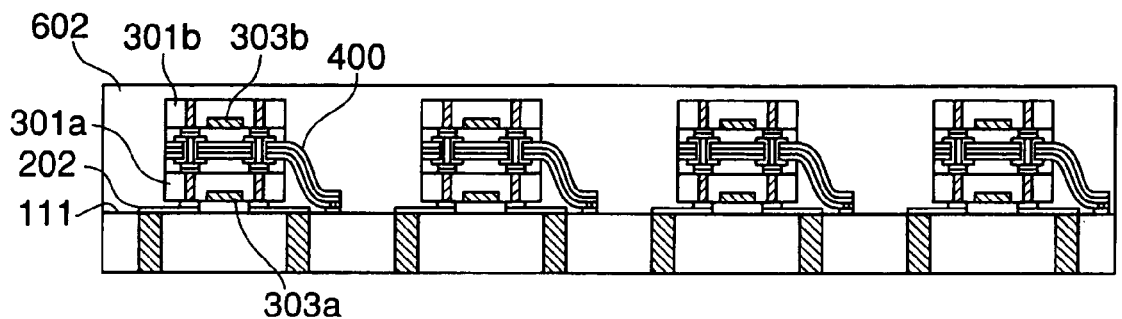
FIG. 15 includes cross-sectional views showing fabrications steps (a)-(c) of the semiconductor package according to the third preferred embodiment of the present invention.
Figure 15:
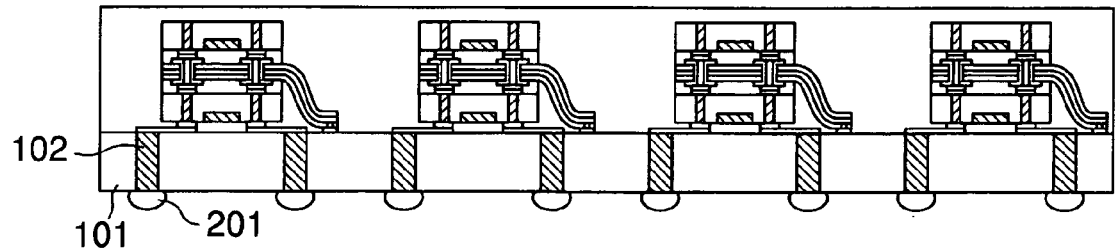
Figure 15:
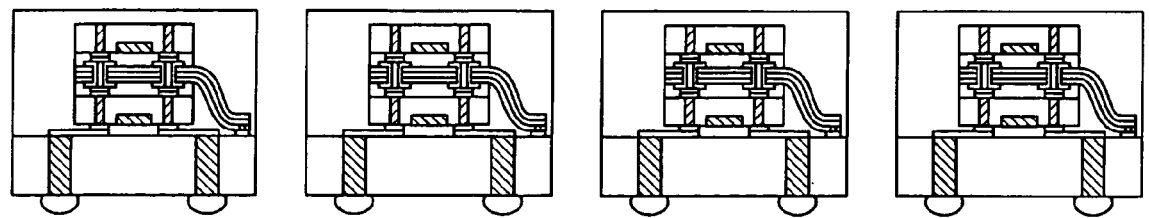

Next, method for fabricating the semiconductor package according to the present embodiment will be described hereinafter. The fabrication processes corresponding to the second step according to the first preferred embodiment is applicable to the present embodiment as well. In the second step according to the first preferred embodiment, the first and second through electrodes 302a and 302b are formed in the first and second semiconductor chips 301a and 301b, respectively; and the contact bumps 203, 204 and 207 are formed. In other words, the second step is a fabrication process carried out until the first and second semiconductor chips 301a and 301b are mounted on the substrate 101. Description of the same fabrication processes as the first preferred embodiment is not repeated hereinafter, but a third step according to the present embodiment is only described. The first step and third step are shown in FIGS. 14 and 15, respectively. In the third step, the above-described process shown in FIGS. 6(a) to 6(d) according to the first preferred embodiment are applied to the present embodiment and the same description is not repeated.

First of all, a first step will be described hereinafter. FIG. 14 includes three drawings (a), (b) and (c) of cross-sectional view used for describing fabrication process of the heat-radiation sheet 400. First, as shown in FIG. 14(a), a first insulating layer 405 is prepared. The first insulating layer 405 corresponds to that in the first preferred embodiment and the same structure is applicable. Next, a heat-transferable conductive layer 404 is formed on the first insulating layer 405. The same or similar fabrication processes of the heat-transferable conductive layer 404 according to the first preferred embodiment are applicable to the present embodiment.

Next, as shown in FIG. 14(b), second through holes (openings) 403a are formed in the third portion 421 of the first insulating layer 405, having the heat-transferable conductive layer 404 thereon. The same or similar fabrication processes of the second through holes 403a according to the first preferred embodiment are applicable to the present embodiment.

Next, an inner side surface of the second through holes 403a and the heat-transferable conductive layer 404 are covered with a second insulating layer 406. The same or similar fabrication processes of the second insulating layer 406 according to the first preferred embodiment are applicable to the present embodiment.

Next, as shown in FIG. 14(c), a first conductive layer 403b is formed on inner side surface of the second through hole 403a, covered with the second insulating layer 406, on the first insulating layer 405 in the first portion 401 and on a part of the second insulating layer 406 in the first portion 401. The fabrication processes of the first conductive layer 403b according to the first preferred embodiment are applicable to the present embodiment.

Next, first through holes 503 are formed in the second portion 402 of the heat-radiation sheet 400 by a mechanical, such as punching, or a chemical manner, such as etching. Heat generated at the first semiconductor chip 301a and the second semiconductor chip 301b is transmitted via the second insulating layer 406 in the second portion 402 and the sealing member 602 to the substrate 101. According to the present embodiment, the heat-radiation sheet 400 is prevented from being broken at a part, so that a heat-radiation characteristic is prevented from being degraded.

Next, the first insulating layer 405, formed on the fourth portion 422, is selectively etched so as to expose a part of the heat-transferable conductive layer 404. After that, a second conductive layer 408 is formed on the exposed regions.

Next, contact bumps 205 and 206 are formed on the first conductive layer 403b, formed on the first and second insulating layers 405 and 406. Fabricating process of the contact bumps 205 and 206 according to the first preferred embodiment are applicable to the present embodiment.

Next, the third step according to the present embodiment is described.

The third step according to the first preferred embodiment, shown in FIGS. 6(a)-6(d) are applied to the present embodiment. In the third step, firstly a substrate 101 is prepared and lastly sealing layers 601 are formed.

Next, as shown in FIG. 15(a), a sealing member 602 is formed to cover the first surface 111 of the wafer 100, the upper wiring pattern 202, the first semiconductor chip 301a, the heat-radiation sheet 400 and the second semiconductor chip 301b.

Next, an upper surface of the sealing member 602 is polished, for example, by a mechanical or chemical polishing manner. Preferably, the polishing process is carried out so that a distance between an eighth surface 312b of the second semiconductor chip 301b and the top (upper) surface of the sealing member 602 would be not longer than 100 μm. As a result, a packaging density of the semiconductor package 001 can be improved.

Next, as shown in FIG. 15(b), outer contact terminals 201 are formed to be connected to the first through electrodes 102 of the substrate 101.

Lastly, as shown in FIG. 15(c), the wafer 100 is diced to form individual semiconductor packages 001 by, for example, a mechanical process.

Embodiments of the present invention have been explained above, but the present invention is not limited thereto, and design changes which do not depart from the technical concept described in the appended claims are possible.

According to the present invention, three or more semiconductor chips may be layered in a semiconductor package. Further, a heat-radiation sheet (400) may be arranged between every two adjacent semiconductor chips. The more semiconductor chips are layered in a package, the more heat is generated in the package. The advantages of the present invention are remarkable for that kind of semiconductor package.

What is claimed is:

1. A semiconductor package, comprising:
   a substrate including:
      a first surface having a first region and a second region surrounding the first region,
      a second surface opposing to the first surface, and
      a first through electrode extending between the first surface and the second surface;
   a first semiconductor chip including:
      a third surface,
      a fourth surface opposing to the third surface, and
      a second through electrode extending between the third surface and the fourth surface to be electrically connected to the first through electrode of the substrate,
      wherein the first semiconductor chip is mounted on the first region of the substrate so that the first surface of the substrate and the third surface are faced with each other;
   a heat-radiation sheet including:
      a heat-transferable conductive layer,
      first and second insulating layers disposed respectively on two surfaces of the heat-transferable conductive layer, thereby forming fifth and sixth surfaces,
      a first portion having a third through electrode extending between the fifth and sixth surfaces to be electrically connected to the second through electrode of the first semiconductor chip, and
      a second portion extending from at least a side of the first portion and being connected to the second region of the substrate, a through hole being formed in the second insulating layer in the second portion to expose a part of the heat-transferable conductive layer to air, so that the heat-transferable conductive layer can radiate heat into the air via the through hole, wherein the heat-radiation sheet is mounted on the first semiconductor chip so that the fourth surface and the fifth surface are faced with each other; and a second semiconductor chip including:

a seventh surface, an eighth surface opposing to the seventh surface, and a fourth through electrode extending between the seventh surface and the eighth surface to be electrically connected to the third through electrode of the heat-radiation sheet, wherein the second semiconductor chip is mounted on the first portion of the heat-radiation sheet so that the sixth surface and the seventh surface are faced with each other.

2. A semiconductor package according to claim 1, wherein the third through electrode comprises a second through hole extending between the fifth and sixth surfaces, and a first conductive layer formed to extend between the fifth surface and the sixth surface via the second through hole.

3. A semiconductor package according to claim 1, wherein the first insulating layer at the second portion of the heat-radiation sheet has an opening that exposes a part of the heat-transferable conductive layer, and the semiconductor package further comprises a second conductive layer, which is formed on the first surface of the substrate and is electrically connected to the exposed part of the heat-transferable conductive layer.

4. A semiconductor package according to claim 3, wherein the second conductive layer is connected to the first through electrode of the substrate.

5. A semiconductor package according to claim 1, wherein the heat-transferable conductive layer of the heat-radiation sheet comprises a wiring pattern, which is electrically connected to the third through electrode.

* * * * *